United States Patent [19]

Carlstedt

[11] Patent Number: 5,555,434
[45] Date of Patent: Sep. 10, 1996

[54] COMPUTING DEVICE EMPLOYING A REDUCTION PROCESSOR AND IMPLEMENTING A DECLARATIVE LANGUAGE

[75] Inventor: L. Gunnar Carlstedt, Partille, Sweden

[73] Assignee: Carlstedt Elektronik AB, Gothenburg, Sweden

[21] Appl. No.: 212,566

[22] Filed: Mar. 14, 1994

Related U.S. Application Data

[63] Continuation of Ser. No. 739,536, Aug. 2, 1991, abandoned.

[30] Foreign Application Priority Data

Aug. 2, 1990 [SE] Sweden .................................. 9002558

[51] Int. Cl.$^6$ ................................ G06F 1/00; G06F 3/00
[52] U.S. Cl. .......................... 395/800; 395/775; 364/258; 364/DIG. 1
[58] Field of Search .............................. 365/49; 395/650, 395/700, 800, 775

[56] References Cited

U.S. PATENT DOCUMENTS

| | | | |
|---|---|---|---|
| 3,253,265 | 5/1966 | Lindquist | 365/49 |
| 3,413,616 | 11/1968 | Lindquist | 365/49 |
| 4,075,689 | 2/1978 | Berkling | 364/200 |
| 4,447,875 | 5/1984 | Bolton et al. | 364/200 |
| 4,502,118 | 2/1985 | Hagenmaier, Jr. et al. | 364/200 |
| 4,598,361 | 7/1986 | Logsdon et al. | 364/200 |
| 4,616,303 | 9/1986 | Logsdon et al. | 364/200 |
| 4,616,315 | 10/1986 | Logsdon et al. | 364/200 |
| 4,654,780 | 3/1987 | Logsdon et al. | 364/200 |
| 4,734,848 | 3/1988 | Yamano et al. | 364/200 |
| 4,755,974 | 7/1988 | Yamada et al. | 365/49 |
| 5,072,422 | 12/1991 | Rachels | 365/49 |
| 5,173,872 | 12/1992 | Crawford et al. | 365/49 |

FOREIGN PATENT DOCUMENTS 2227583  8/1990  United Kingdom.

OTHER PUBLICATIONS

Patrick G. McKeown, Living With Computers, 1988, Chapter 3.
By M. Ercegovac et al., "Reduction Machines", High-level language computer architecture, 1989, Chapter 11, pp. 413–469.
"Pegasus—An ASIC Implementation of High Performance Prolog Processor" by Yokota, T. et al, EURO ASIC '90, pp. 156–159.
"An Associative Processor for Logic Programming Languages" by Naganuma, J., System Sciences, 1991 Annual Hawaii Int'l Conference pp. 229–236.
"A Tag Coprocessor for RISC Architectures" by Cheung, P. et al, IEEE Colloq. (1991) No. 163: RISC Architectures and Applications.
"Silicon Compilation of Algorithm Structures" by Gaillard, T. et al, EURO ASIC '90, pp. 480–484.
"Extending a Prolog Architecture for High Performance Numeric Computations" by Yung, R. et al, System Sciences, 1989 Annual Hawaii Int'l. Conference, vol. I pp. 393–402.
"Performance Evaluation of Integrated Prolog Processor IP.P" by Abe, S. et al, Artificial Intelligence for Industrial Applications, 1988, pp. 505–510.

*Primary Examiner*—Alvin E. Oberley
*Assistant Examiner*—Michael T. Richey
*Attorney, Agent, or Firm*—Young & Thompson

[57] ABSTRACT

A computing device implements a functional programming in hardware and operates as a reduction processor. Programs to be evaluated are represented as a directional graph of closures, where each part of a program is represented by a closure. During execution, this directional graph of closures is gradually reduced according to the reduction rules of the declarative language used. The device has an active associative object storage having storage cells able to store and execute at least part of a computer program. The device has several ports that contain storage cells and which are able to exchange and compare data and programs through a unification of internal and external behaviors.

8 Claims, 9 Drawing Sheets

SIMPLE VALUE OR
MACHINE IDENTIFIER

ONE LEVEL STRUCTURE

TWO LEVEL STRUCTURE

TWO LEVEL STRUCTURE

THREE LEVEL STRUCTURE

IN PIPELINE MODE

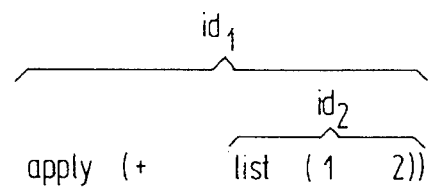
FIG. 12A
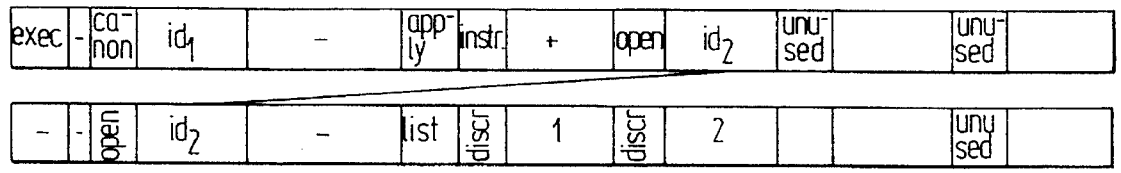
FIG. 12B
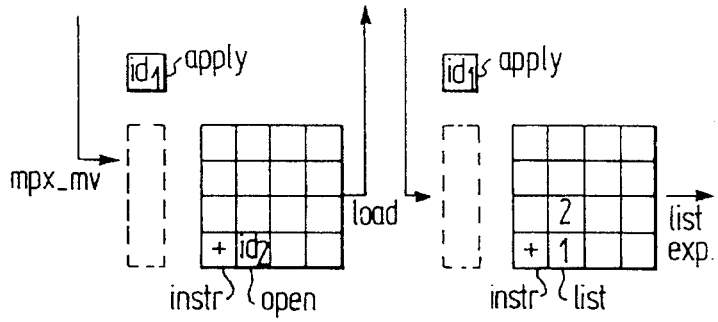
FIG. 12C  FIG. 12D
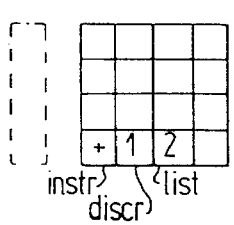  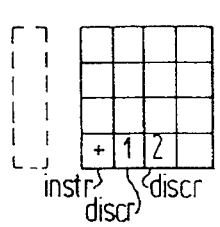  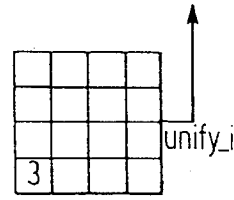
FIG. 12E  FIG. 12F  FIG. 12G

COMPUTING DEVICE EMPLOYING A REDUCTION PROCESSOR AND IMPLEMENTING A DECLARATIVE LANGUAGE

This application is a continuation of application Ser. No. 07/739,536, filed Aug. 2, 1991, now abandoned.

BACKGROUND OF THE INVENTION

Computers were invented during the 1940's. Since then they have been developed with a revolutionary speed. In spite of this, current days computers have almost the same architecture as the first ones.

Most improvements have been in the hardware. The introduction of VLSI and the enhancement in lithography has made it possible to build one chip computers that only five years ago were called super computers. The line width has shrunk exponentially and is now less than 1 micrometer. The clock rate as well as the number of active transistors have increased many orders of magnitude. Physical limitations will probably limit the line width to 0.2 micrometer.

During the same time the computer architects have not improved in the use of silicon. On the contrary, most computers have been using more than the optimal amount of silicon in order to be faster.

Both these facts will stop the evolution of the speed of single processors in the next five years. Parallel processors are introduced resulting in an increased hardware cost because of rising complexity and, for most types of programs, a prohibitive increase of programming costs.

Seen in relation to each other, the hardware costs have shrunk but the programming costs of new systems have grown considerably and will soon be at a prohibitive level.

computer is a complicated assembly of different units in software and hardware. Different paradigms and stages in the evolution have created standards—ad hoc and established that are spread out into the system. Because of this nonuniformity there is a great number of interfaces.

All these interfaces and paradigms of different quality and style have made it hard for a user or a programmer to use the machine—it requires a lot of knowledge—and because of the complexity a programmer might introduce hidden errors.

However, recently so-called reduction processors are developing. A reduction processor executes a program having a certain structure including arithmetic expressions, and this structure is reduced in a number of reduction steps. Thus, the program is not executed in a given sequence as in other kinds of computers.

There have been some difficulties in developing reduction processors above a limited size.

The Development of Programming Languages

The development of the first electronic computer started the development of several programming languages suited for this type of computer, such as FORTRAN, COBOL, Algol, BASIC, Pascal. These languages have been called imperative languages, or conventional languages, mainly because of the fact that they normally give programs that consist of a sequence of commands or instructions to be executed sequentially by a conventional computer, i.e. a computer designed according to the principles developed by John von Neumann. An increasing discomfort with these languages led to the development of another series of languages: LISP, ISWIM, Scheme (a dialect of LISP), ML, Hope, SASL, and so on. The driving force behind the development of these languages was conceptual simplicity; no particular machine influenced the design. It took some time before functional languages began to receive attention—one reason was that functional programs were slow to execute. Later developments have shown that the execution speed, in some cases, can be close to or the same as for conventional (imperative) language programs executed by conventional computers, even though these functional programs are not aimed at being executed by this type of computer.

The Software Crisis

What initiated the massive effort to develop functional languages was an increasing discomfort with imperative type languages. One started to talk about the software crisis around 1970. Programs became increasingly complex and often contained a lot of errors, were difficult to read, difficult to understand and specially hard to modify. One of the reasons is that the expectations that high-level imperative languages would simplify programming were set too high—these languages were not at such a high level as it may have seemed. The imperative languages are still adapted to the early computer concepts, the von Neumann kind of computer, and the level of programming is still fairly close to the machine level.

Functional programming languages have several properties alleviating some of the disadvantages of the more conventional programming languages.

For additional information and understanding we refer to the textbook "Functional Programming Using Standard ML", Åke Wikström, Prentice Hall 1987.

In order to fully understand the objectives and advantages of the invention it is essential to understand what comprises a functional approach in computing. Especially in comparison with the historically more prevalent imperative approach.

The expression "functional approach" means that programs are written in a functional language and stored and executed on a computer comprising hardware specially suited for such a language. Equivalently, the expression "imperative approach" means that programs are written in an imperative language and stored and executed on a computer comprising hardware suited for imperative languages.

However, it is possible to store and execute programs written in a functional language on a conventional computer. The opposite is also possible—programs written in an imperative language can be executed on a computer suited for executing programs written in functional languages.

Properties of Functional Languages

A program written in a functional language can be seen as a set of definitions of properties of objects and as computation rules. The definitions is the declarative part and the computation rules, or reduction or rewrite rules, is the operational part that the computer uses during execution. Functional languages provide a higher-level interface to the computer which makes it possible for the programmer to abstract away from hardware-related details of the computer. As a positive side-effect functional programs are often shorter and easier to understand than conventional imperative programs. One of the main disadvantages with functional languages is that functional programs have to be translated to a conventional language in order to be executed on a conventional computer. This has been done with compilers or interpretating programs. It is clear that some of the benefits of the functional approach has been held back by the fact that no dedicated hardware has existed for the task of storing and executing functional programs in an effective manner.

DEFINITIONS

Below follows a list on expressions used in this specification and their reserved meanings:

| | |
|---|---|
| element | part of something larger in a data structure |
| list | an ordered sequence of elements, each element could in turn be a list |
| inserted list | a part of a list, small enough to be stored in its entirety in one closure. Makes it possible to represent arbitrary long lists |
| closure | a hierarchically structured entity which defines a process. All closures have a root which uniquely defines the closure. The reduction work in a reduction machine is made on closures. The whole state of the machine is transformed by the reductions |
| object storage | memory including storage cells storing objects. For instance an associative memory |
| storage cell | a cell in an object storage. It stores a cell closure, which might refer to other cell closures stored in other storage cells |
| cell closure | the content in a storage cell |
| storage cell field | a field in a storage cell |
| closure element | a data element stored in a storage cell field |
| closure identifier | a closure cell element uniquely designating a closure |
| canonical closure | a closure which cannot be further reduced, i.e. a cell closure which does not contain any closure identifiers designating some other cell closure which might be reduced in such a manner that this cell closure has to be further reduced |
| goal | a closure to be executed, i.e. reduced |
| father | a closure having at least one closure identifier in a value/designation field |
| son | a closure linked to another closure through a closure identifier, which is designating the son |

A son could also be a father. A father could also be a son. A son could have more than one father. A father could have more than one son.

| | |
|---|---|
| closure position | whether the closure is a root or a node |
| root | the top most closure cell in a closure tree |
| node | a closure cell in a closure tree not being a root |
| where | a storage cell field containing a closure position |
| type | type code in a cell closure, i.e. a bit pattern representing a property of an object, e.g. an instruction code |
| lazy | an element in a cell closure which indicates if it is executable or a postponed evaluation or inactive |
| identifier | a special kind of closure element used to denote an object stored in a storage cell |
| environment | objects may be grouped by giving them the same environment |
| value/des. | a closure element storing either a simple value, i.e. a direct representation, nothing, or a designation to another closure, i.e. an indirect representation |
| core cell | structure arithmetic unit according to the invention. The core cell is able to perform structure arithmetic involving reducing closures |
| numeric ALU | numeric arithmetic unit able to perform basic numeric and logic operations. The core cell makes use of the numeric ALU for numeric operations |
| full register | register extending through all the planes in a core cell |
| core word | the content of a full register in a core cell |
| limited register | register in a core cell extending through a limited amount of planes dimensioned to include a closure cell element of value/designation type |
| element word | the content of a limited register or a part of a full register having the same extension as the limited register |
| num word | the part of an element word representing a value or a designation |
| tag word | the part of an element word having the tag indicating the feature of the representation in the num word |
| reduction | rewriting/restructuring a closure in accordance with the rules of the particular programming language used |
| behaviour | a time structure such as a sequence or an alternative of sequences unified at a port. Also used degenerated in analogy to the mathematical term empty set in the set theory, such that a "1" could be a behaviour in principle. |

OBJECTS OF THE INVENTION

An object of the invention is to provide a computing device having a declarative programming language.

Another object of the invention is to provide a computing device working as a reduction processor.

Still another object of the invention is to provide a computing device having a programming language, which is simple and which lets the programmer abstract away from all hardware related details and which gives programs that take less time to write and with less errors.

Another object of the invention is to provide a computing device having one language as programming language, operating system and communication protocol.

Still another object is to provide a computing device able to execute a functional language having unification as its binding method.

The above objects have been substantially achieved by constructing a computing device, including a) an active storage means including a plurality of storage cell means each having information able to give rise to performance of an operation, b) at least one port means connected to said active storage means, and c) at least one environment means connected to said at least one port means.

Preferably, it includes means for comparing a signal sequence provided on a port means with a sequence stored in at least one storage cell, the stored sequence having possible undefined sequence elements, in the active storage means, and means for rewriting the comparing sequence into nothing, i.e. something representing contradiction, if the comparison gives a clear difference, or else to rewrite said comparing sequence into a specified sequence.

The comparison means could make comparisons on groups including at least two elements of a predetermined number of list elements.

The signal sequence is preferably provided as a sampled signal changing with time having individual sampling periods, the signal sequence being a list of groups of elements, each group including a duration time and at least one signal quantity during that time. The predetermined number of list elements in each group is suitably two, provided as a pair. Each pair includes a combination of time and signal quantity.

Means could be provided for synchronizing one of said port means with at least another of said port means and to make a parallel indication of signal quantities from said ports during each duration time. In this very manner quantities on different ports could be derived at the same time and possibly be compared to each other.

The storage cell means are preferably provided in a structure in the active storage being adapted for storing a computer program in the form of an explicit or implicit encoding of an abstract syntax, the syntax describing a number of different abstract objects by aid of expressions, each storage cell means being capable of storing at least a part of one said syntax expression at the time in the form of a suitable data and/or program structure.

Each kind of expression could also have a corresponding kind of expression indicating that it is a program form, all program forms being expressions which are adapted to be reduced into themselves and therefore stand still. This makes it possible to write interpreters and compilers for other languages of any arbitrary kind.

Rewriting means cooperating with said storage cells rewrite the syntax expressions in accordance with predetermined rewriting rules.

SUMMARY OF THE INVENTION

The computing device according to the invention is preferably a computer having the declarative programming language made in hardware, in which case the programming language also is a machine language. However, like every electronic device nowadays also the wiring of the computing device according to the invention could be simulated in a computer of common kind provided with an interpreter or a compiler. Examples of such machines are machines based on the M68000 processor, for instance a Sun3/SUN3 computer by Sun Microsystems, Inc. However, according to the invention the machine has a port in which unification capabilities are provided.

Execution by Reduction

A program to be executed can be represented by a directional graph of closures, where each part of a program is represented by a closure. During execution this directional graph of closures is gradually reduced according to the reduction rules of the language used. When there are no executable closures left the execution of the program is finished. A directional graph of closures could be regarded as tree structure where each node in the tree is a closure and where the topmost node is called the root. Execution by reduction is then normally performed by reducing the tree structure bottom-up, reducing the parts of the tree furthest away from the root and working towards the root. This kind of execution is normally called demand driven execution, i.e. the execution of parts of a program depending on the result of the execution of other parts is postponed until the result is available.

BRIEF DESCRIPTION OF THE DRAWINGS

For a more complete understanding of the present invention and for further objects and advantages thereof, reference is now made to the following description taken in conjunction with the accompanying drawings, in which:

FIG. 10A to 10H, 11A to 11G, 12A to 12G show examples of the operation of the computing device according to the invention.

DESCRIPTION OF THE PREFERRED EMBODIMENTS

The Computing Device

Figure 1:
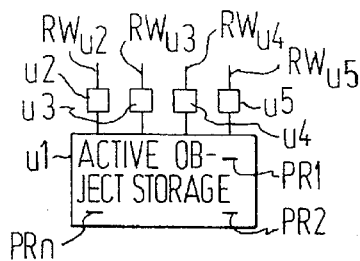
FIG. 1 is a schematic diagram of the computing device according to the invention.

The computing device according to the invention schematically shown in FIG. 1 includes an active memory U1, below called active object storage. It is active because it includes storage cells, each having the opportunity to give rise to a performance of a computing operation. Preferably, each object storage cell is divided into several storage fields, and an associative search through the object storage may be done on the contents in storage fields. A storage cell could store a cell closure. A cell closure can store designations to other cell closures as closure elements. A function can be stored as a closure tree including several cell closures designating each other. A further description of these features will be given below.

The object storage provides an internal behaviour of the computing device according to the invention. In the object storage several internal behaviours PR1, PR2, ... PRn for each port are stored in different places, i.e. in different storage cells. A number of ports U2 to U5 are connected to the active object storage U1. Input signals $RW_{U2}$ to $RW_{U5}$ to the ports U2 could be provided by sensors or informations provided by devices outside the computing device, i.e. in the real-world environment.

Behaviours

A behaviour is a structure of basic elements which can alter with time. Thus, the behaviour is a time structure but does not indicate why a structure alters. The time structure may be considered as the state of a composed process. The computing device according to the invention is particularly adapted to a declarative kind of programming language, below called H. It has no explicit specification of state and transition as in imperative languages. Instead all behaviours are specified by expressions. The term behaviour is thus a structure in time, a sequence or an alternative of sequences. It is also used in a degenerated form for all possible values, as compared with the use of empty set in the mathematical theory of sets.

The port transforms the incoming signal into a form adapted to the active object storage, for instance digital form, and provides it in a form which can be compared with information in the active object storage. This information, local for the port in question, includes one or several alternative behaviours PR1, PR2, ... PRn.

Figure 2:
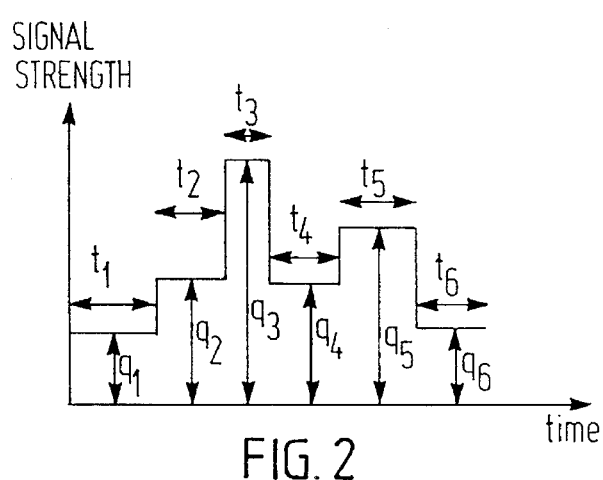
FIG. 2 is a diagram of a signal sequence at a port.

A port Ui, i being a number between 2 and 5, sees parts of the real-world surrounding provided as a behaviour, which is composed by an endless time sequence of values. The sequence is storable in a tree structural form inside the computing device, as will be described further below. An example of such a sequence is shown in FIG. 2. The sequence of sampled signals could be changing with time, i.e. the sampling periods can be individual, as apparent from FIG. 2, either chosen by the computer program or given by the surrounding. The signal sequence is here provided as a list of elements in pairs. Each pair includes a duration time and a signal quantity during that time. It is also possible to have more than one signal quantity per time period. This could for instance be made by a port having the ability to handle more than one signal quantity per duration time or by having some parallel ports each having the possibility to handle one signal quantity per duration time. The ports are then synchronized with each other.

Unification of Behaviours

According to the invention the input and output through a port to the surroundings is made by a unification of processes provided on each side of it, i.e. of internal behaviours in the computing device and of external behaviours in its surrounding. A program written in the functional language H provided in the active object storage creates the local behaviours. The real-world behaviour describes one protocol in real-time. Thus, the ports of the computing device towards the surroundings register the actual behaviour of the surroundings visible from the computing device. It is unified with the protocol described in the computer. How this is done in the computing device according to the invention will be described further below. Both the internal behaviours of the computing device and the external behaviours are thus modelled in the same way, which provides a very elegant way of operation making the computing device quite suitable to perform real-time operations.

Thus, the computing device includes at least one comparison means for comparing a signal sequence provided on a port toward the surroundings with a sequence stored in at least one storage cell, in most cases several storage cells, in the active object storage. At the unifying operation all alternative internal behaviours which are not in conformity with the behaviour in the real-world environment are deleted. A correct program should have only one of the alternative behaviours left after the unifying operation, and this behaviour must coincide with the behaviour at the port in question. If none of the alternative internal behaviours should correspond to the real-world environment at the port in question, the unifying operation will give nothing as its result, which is considered as a programming error.

The H Port

The description of the input/output port above could be generalized to be able to handle input and output of other data structures than during-structures. In this case, instead of unifying an internal behaviour with an external behaviour by unifying time durations and signal quantities, a unification of bit patterns could be performed. The incoming signal could be digital. Further, the incoming signal could represent data structures or program structures, such as H language programs. For instance, a storage cell field in a storage cell in a port could be unified with bitpatterns on the input of the port.

Figure 11A:
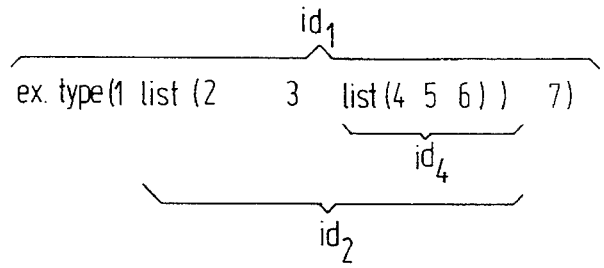
Figure 11B:
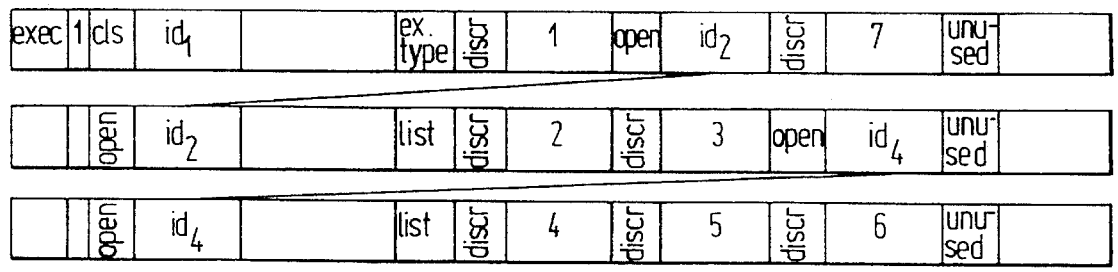

An example : an internal structure apply ($1 $2) could be unified with bitpatterns on the input so that the final unified internal structure reads: apply(+list (1 2)), which is the structure shown in FIG. 11A and 11B. Here $1 and $2 represents "any bitpattern". $1 is unified with the bitpattern representing the instruction code for "+" and $2 is unified with the bitpattern representing "list (1 2)".

Through the H port, which accept H language code, a program could be loaded into the object storage. The H port could also be used between processors, which would allow them to transfer programs or data or both. Transferred program code could initially be marked as data to prevent immediate execution of it. The H-port can also be used as an interface between the computing device according to the invention and another kind of computing device which then can be of previously known and hence conventional kind.

The Object Storage

In the embodiment of a computing device shown in FIG. 3, an object storage 1 includes a number of storage cells 2, each divided into several storage fields, as will be described further below. Since the exact structure of the object storage is not a part of the actual invention it is not described in detail. An object storage which can be provided as the object storage 1 is described in our copending application Ser. No. 07/739,532, now U.S. Pat. No. 5,379,387.

The Structure Arithmetic Unit

Each storage cell in the object storage is able to store a cell closure including several closure elements. The object storage 1 is connected to a structural arithmetic unit 3 through a memory bus arrangement $BUS_1$ to $BUS_N$ being wide enough to connect every bit cell in one storage cell to the unit 3. Each bit in each storage cell is connected to the corresponding bits in all the other storage cells through the bus arrangement. The structural arithmetic unit 3 can be a particular part of the object storage 1 into which the closures to he reduced are temporarily moved during the reduction procedure. However it is also possible to have a particular structure of the unit 3, as will be illustrated further below, making it possible to provide fast and direct reduction operations. Since the exact structure of the unit 3 is not a part of the actual invention it is not described in detail. A unit which preferably can be provided as the unit 3 is described in our copending application Ser. No. 07/739,532, now U.S. Pat. No. 5,379,387.

Figure 3:
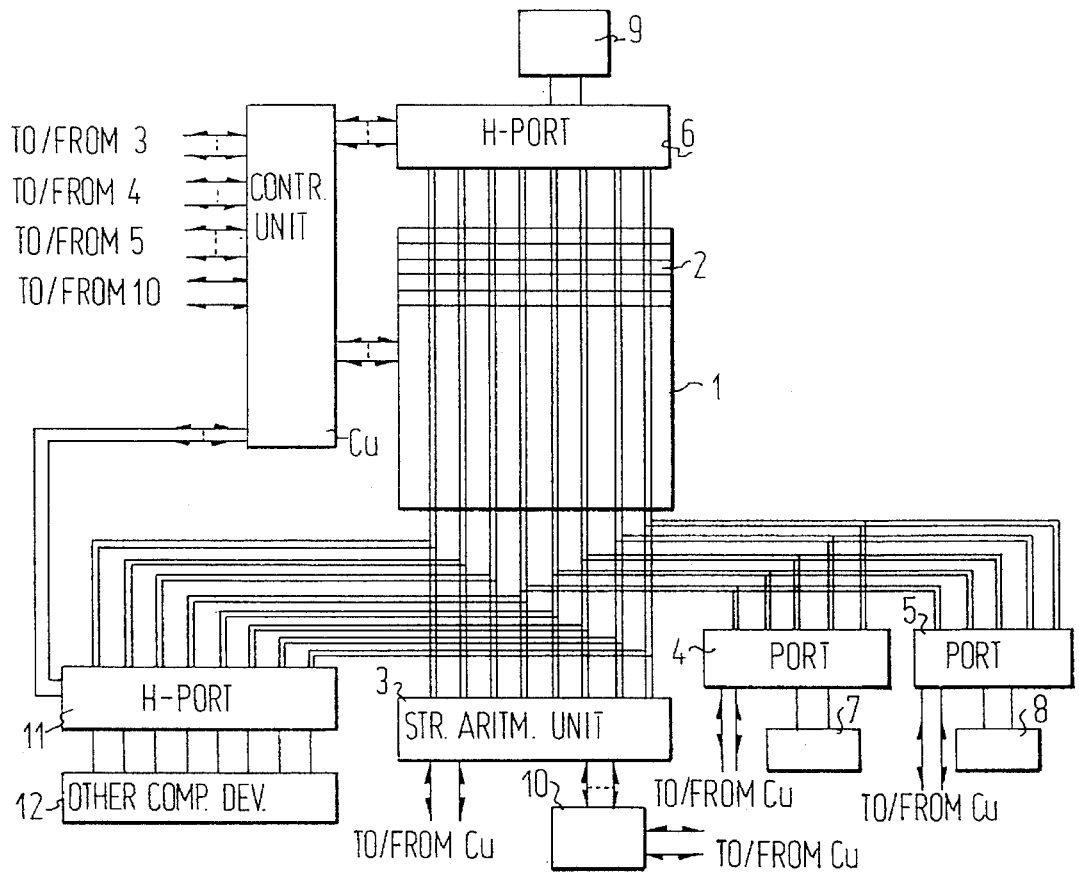
FIG. 3 shows a schematic block diagram of an embodiment of a computing device according to the invention.

The computing device shown in FIG. 3 is built up around the memory bus arrangement $BUS_1$ to $BUS_N$ so that practically all the data operating devices have direct access to it. In this way the unit 3 and the ports can be regarded as belonging to the active object storage, i.e. as particular cells in it.

The Central Control Unit

A central control unit CU controls both the object storage and the structural arithmetic unit 3. Several ports 4, 5, 6, 11 also controlled by the central control unit CU are connected to the unit 3. Two of the ports 4 and 5 are shown to be unification ports connected to the surroundings. An external device 7 and 8, respectively, such as a sensor or a device controlled by and/or controlling the computing device, is connected to each port. The port 6 is an H-port connected to another computing device 9 which delivers programs to be inserted in the computing device. The port 11 is an H-port connected to another computing device 12 for instance of the same kind as the computing device 1 to 6, 10, 11, CU with which it stands in communication. Several computing devices of the kind shown in FIG. 3 can be interconnected directly with a transmission between their memory bus arrangements and a temporary storage closure (not shown) in each device to provide a multi parallel computing device. In this way the global search possibilities can be preserved. However, in some applications it is convenient to interconnect two or three computing devices or multi parallel computing devices by an H-port 11 so that each computing device works as a separate computing device and the devices are sending programs and/or data between them for separate processing. An H-port 11 can also be used as an interface to another kind of processor. When the H-port transmits a program the transmission is the same as for transmission of data, and the computing device handles it in the same way.

The Numeric ALU

An extra device 10 for making particular operations of special kinds can also be connected to the unit 3. An example of such a device is a numeric arithmetic unit, below called numeric ALU. However, the extra device 10 can also be used for comparison purposes or the like. The numeric ALU could be almost any ALU common in the art but a numeric ALU particularly suited for the computing device according to the invention is described in our copending application Ser. No. 07/739,535, now U.S. Pat. No. 5,241,491.

The Comparing

The active storage including the unit 3 has at least one comparing possibility for comparing a signal sequence provided on one of the ports, for instance 4, with at least one sequence provided on at least one of the other ports, for instance 6.

This comparing possibility can be provided directly in the storage or at the ports by providing the closure having values, such as pairs of intervals each having a duration time and a value in form of a signal quantity. However, it is also possible to make the mere comparison in the extra unit 10. Also when two external behaviours are compared the comparing sequences are rewritten into nothing if the comparison gives a difference, i.e. the duration times or the signal quantities at the ports to the surroundings are not alike. Otherwise, the compared sequences are rewritten into one and the same specified sequence.

Thus, the active object storage 1, 3 has a structure capable of storage and executing a computer program in the form of an explicit or implicit encoding of an abstract syntax. The syntax describes a number of different abstract objects by aid of expressions. Each storage cell is capable of storing at least a part of a syntax expression at a time in the form of a suitable data and/or program structure. The syntax will be described in more detail below.

Object Storage Capabilities

The object storage 1 has substantially more intelligence than an ordinary RAM type memory. It is associative which makes it able to provide more services than "read" and "write" as provided by an ordinary RAM type memory.

A mentioned above, the object storage is divided in storage cells 2, each including several storage fields. The provided services are on a high level. For instance it is possible to find all occurrences of a particular data element whatever place it has within the individual storage cells and to rewrite the found particular data element globally, i.e. within the whole object storage, to a new value using only one memory instruction. Since the object storage is associative this rewrite operation could be made in two physical memory cycles independent of the number of the affected storage cells.

The Storage Cell

Figure 4:
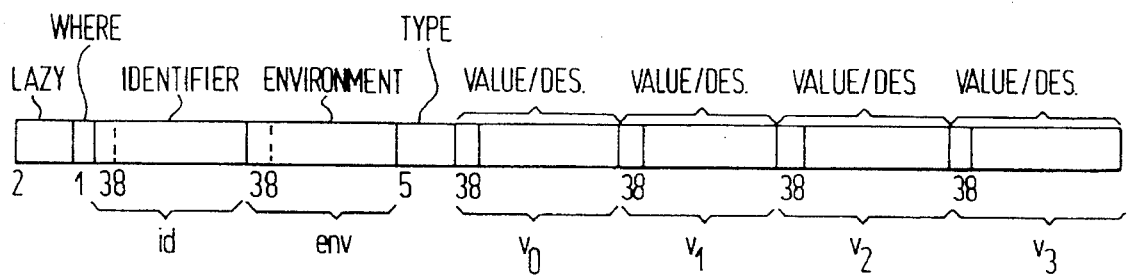
FIG. 4 shows schematically the use of different fields in a storage cell in an object storage in the embodiment shown in FIG. 3.

An embodiment of a storage cell 2 is schematically shown in FIG. 4. It can store two kinds of elements and includes storage fields particularly adapted to the elements to be stored. These fields have been given the same names in FIG. 4 as the elements to be stored in them.

Each storage cell is adapted to store at least some of the properties in the following enumeration: marks denoting if the expression in said cell shall be reduced, marks denoting if the expression is a member of a tree, the properties of the expression, marks denoting how the expression is created, marks denoting if the expression constitute a number of repeated behaviours, marks denoting if the expression only is a part of a list having other list members stored in another storage cell.

The first kind of elements, below called the attribute elements, describe different states of the storage cell. One element of this kind is LAZY, which denotes whether the cell is idle, in which case the rest of the content of the cell is regarded as passive information, exec, i.e. is in an executable state, or wait, i.e. the evaluation of the cell has been postponed and it is waiting for a result before it can be executed. Another attribute element is TYPE, which includes an type code (par, seq, apply, list, unify etc).

The second kind of elements, below called object elements, describe identification, environment or value. These are IDENTIFIER, ENVIRONMENT, VALUE/DES. These object elements are adapted to be stored in the parts of the core registers provided in the planes HEAD add NUM (see FIGS. 8B, 8C). Each of these elements includes an element word, which in turn is divided into a num word and a tag word.

The Tag Word

The closure elements of the second kind has a tag word indicating the feature of the num word. The tags are of two kinds, indirect tags, i.e. tags used for identifiers and environments, and direct tags, i.e. tags used for simple values or the like.

Examples of indirect tags are cls, canon, and open. If the tag word is cls it means that the num word represents a closure which might be reduceable. If the tag word is canon it means that the num word represents a closure which can not be further reduced. If the tag word is open it means that the num word represents a closure being an inserted list.

Examples of direct tags are discr, cont, unused and nothing. If the tag word is discr it means that the num word is an integer. If the tag word is cont it means that the num word is a floating-point value. If the tag word is unused it means that the num word lacks meaning. If the tag word is nothing it means that the num word represents nothing, i.e. a unification on a closure including a field marked nothing will always be nothing.

Identifiers & Environment

If an identifier field in a storage cell includes an identifier element, the process state in that storage cell could be transferred to the structural arithmetic unit 3, below called the core cell. Each of the storage cell fields VALUE/DES could contain an identifier denoting another cell closure, thereby providing a link to this other cell closure. The environment fields could include an identifier designating the root closure in the network part, i.e. tree, of closures providing the environment of the closure. However, the environment field could also have other uses. The environments could be used to keep track of the creator of a structure by storing the identifier of the creator in the environments of all cell closures created. For example all closure cells in a subtree, in which all symbols having the same name shall stand for the same thing, could be grouped by having the same environment. In this way the whole structure is accessable from one closure in the tree, through the root, in one operation only.

The designation function could be regarded as a directed link from a father to a son, i.e. a closure element is uniquely identifying a cell closure. The behaviour of a machine having an object storage of the associative kind is thus represented as a directional graph of closures.

Thus, if the environment of a closure is given, the root closure within this environment could be found. A root closure of an environment is provided with a particular mark (for instance "1") in the field WHERE in its storage cell. A node closure of an environment is provided with another mark (for instance "0") in the field WHERE.

An Example

Figure 5:
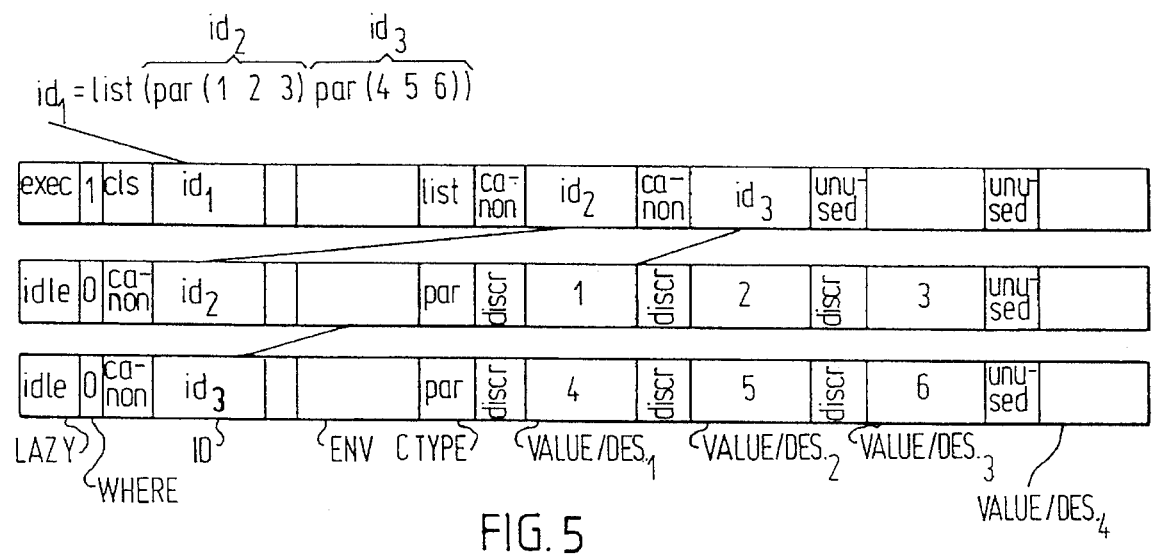
FIG. 5 shows an example of how a function can be stored in the storage cells in the object storage.

An example is shown in FIG. 5 of a storage cells storing the expression $id_1$=list(par(1 2 3) par(4 5 6))

which is a list of two parallel value combinations. The first parallel combination par (1 2 3) has the identity $id_2$, and the second parallel combination par (4 5 6) has the identity $id_3$. The root storage cell including the cell closure having the identity $id_1$ in the tree is tagged cls, has the notation exec in the LAZY field, has a "1" set in the WHERE field, has the notation list in the TYPE field, and has $id_2$ and $id_3$ in the first two value/des. fields. The tags of these fields are marked canon because the contents of these fields are indirect and linked to canonical closure cells. The node storage cell including the cell closure having the identity $id_2$ has a "0" set in the WHERE field, has the notation par in the TYPE field, and has the discrete values 1, 2, and 3 stored in the first three value/des. fields. The tags of these fields are therefore marked discr. The node storage cell including the cell closure having the identity $id_3$ has a "0" set in the WHERE field, has the notation par in the TYPE field, and has the discrete values 4, 5, and 6 stored in the first three value/des. fields. The tags of these fields are therefore also marked discr.

The Port as the Interface to the Outside World

As mentioned above, the processing device according to the invention is provided with one or several ports for input/output of data to and from the device. Each port is a unit providing the communication to the external surrounding of the processing device. The port is preferably connected to a transforming interface (not shown) in the object storage 1 (See FIG. 3). The port can be seen as a prolongation of the object storage since it contains preferably four storage cells similar in function and compatible with the object storage cells 2 (see FIG. 4). The port performs input/output-operations through unification.

Internal Behaviour

The object storage provides an internal behaviour of the processor, one behaviour for each port provided. A behaviour is the semantic meaning of a time structure, which could be represented by a closure structure. The time structure may be considered as the state of a process composed by an endless time sequence of values.

External Behaviour

Input signals to the port(s) could be provided by sensors or devices outside the processor, i.e. in the real-world environment. The port transforms the incoming signals into a digital form adapted to the object storage format, i.e. to a closure representation. This closure representation is a time structure, i.e. a behaviour, comparable to the internal behaviours in the processor. Thus, from the viewpoint of the processor this time structure can be seen as an external behaviour.

The input and output through a port is made by a unification of processes provided on each side of it, i.e. of internal behaviours in the processor and of external behaviours in its surrounding. Both the internal behaviours and the external behaviours are modelled in the same way, which provides a very elegant way of operation making the processor quite suitable to perform real-time operations.

An example of an external behaviour, i.e. a time sequence, is shown in FIG. 2. The sequence of sampled signals could be changing with time, i.e. the sampling periods can be different, as apparent from FIG. 2. The signal sequence is here provided as a list of pairs of elements. Each pair includes a duration time and a signal quantity during that time. The signal quantities are marked $q_i$ and the time durations are marked $t_i$, where i is a number between 1 and 6.

The port to the surroundings, such as the port 4 in FIG. 3, could for instance be connected to a sensor 7. The interface at the port could handle all types of signals from a general point of view. However such kind of interfaces are complicated and will often introduce disturbances into the system. Therefore, a preferable interface should have the following qualities:

1. A signal is measured at certain times. The measured signal is regarded to be constant until the next measurement.
2. The time could be given either with a fixed cycle determined by the port, or a fixed cycle determined by the program in the machine, or at certain intervals determined by the program or by external clock signals.
3. The measured signal is provided in digital form to the machine.
4. The digitized signal is either boolean or is coded into a digital form which could indicate an integer or a floating-point value.

Thus, the computing device according to the invention does not insert or output values like common processors. In the inventive processor the port is regarded as an interface between a program in the processor and a surrounding to the processor. The computing device is adapted to the functional program language H. The interface is such that a course of events is provided which appears both as a signal on one side of it and as an H-structure in a processor program on the other side. The surrounding sets its part of the physical picture and the processor its part, and this is made simultaneously from both sides of the port or interface so that the two will be the picture of the same thing which makes the computing device picture a real time as near to the exact real time it is possible to come.

The program is stored in the active object storage and creates the internal behaviours. The program execution is based upon that both the program in the computing device and the surrounding sees the same real time course of events in the interface.

The program describes the interface as an endless long list of pairs of values and duration times, i.e. each signal value lasts during a duration time. Thus during each interval, including a pair of a signal value and a duration time, the interface describes the duration time length and the value. All such pairs are provided in a sequence, and a port converts a real time behaviour to the same type of list.

The input and output to and from the computing device is made by unification. This means that the duration time and the value within each interval are made alike at both sides of the port.

The program could specify a specific signal quantity value or it could leave the signal quantity value unspecified by using a particular symbol, for instance $, denoting all possible values.

A correct program should have only one of the alternative behaviours left after the unifying operation, and this behaviour must coincide with the behaviour at the port in question. If none of the alternative internal behaviours should correspond to the real-world environment at the port in question, the unifying operation will give nothing as its result, which is considered as a programming error since nothing represents contradiction. Having more than one alternative behaviour left after the unifying operation is also considered as a programming error.

When the internal behaviour specifies a specific signal value, also called signal quantity, this specific signal value is output to the surrounding. If the internal behaviour leaves the signal value unspecified a specific signal value is input from the surrounding.

When the internal behaviour specifies a specific duration time in an interval, then the surrounding admits an arbitrary duration time length. If the internal behaviour leaves the duration time unspecified the surrounding determines the duration time.

The mechanism is thus symmetrical:
1. An interval, having the expression during, includes a duration time and a signal quantity.
2. The interval is described in a program by the form during duration time signal quantity.
3. The surrounding may describe such an interval in different ways, as described above.
4. The port defines the signal quantities both of its sides. This means that a signal quantity must be determined. The program in the computing device sets a duration time or a signal quantity on the side of the port turned towards the computing device. An output is made during a certain duration time and/or a signal quantity is fed to the conductors of the port on its side turned to the surrounding.

An Embodiment of a Port to the Surrounding

Figure 6:
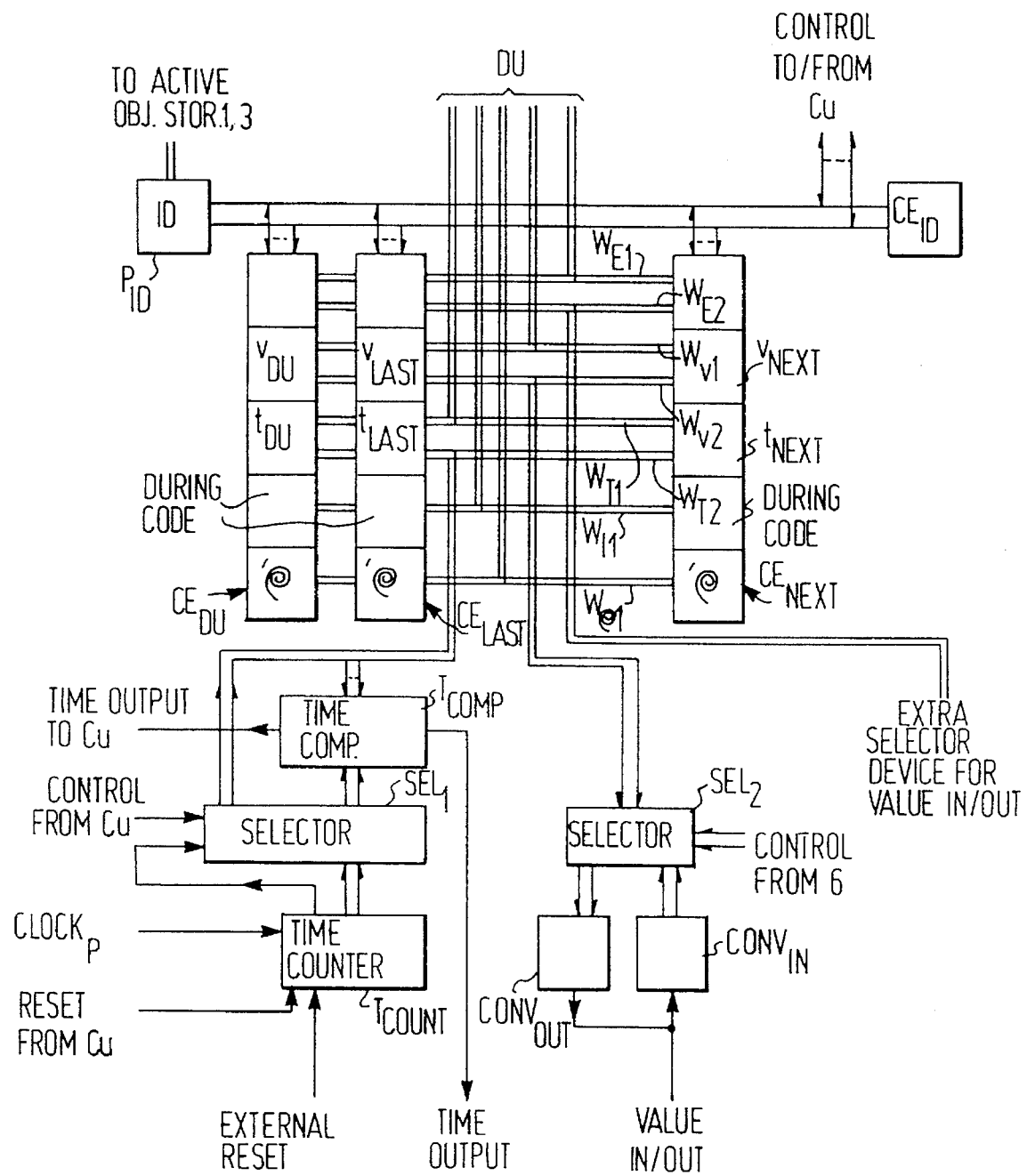
FIG. 6 shows an embodiment of a port to the surroundings.

An embodiment of a port for input and/or output of intervals is shown in FIG. 6. The port is connected to the structural arithmetic unit 3 or directly to the object storage 1 with a bus arrangement DU. Each bus in the bus arrangement DU represents a bus having for instance 38 wires. The port is controlled by the central unit CU. The port includes an identifier register $P_m$. The identifier stored in the register $P_m$ can be used as an identifier in the object storage 1, i.e. it can be used to link the port to cell closures in the object storage. This identifier is only used internally within the processor. The port also includes an identifier register $CE_m$, which can be used in a similar way as the register $P_m$. The port also includes a number of storage cells $CE_{DU}$, $CE_{LAST}$, $CE_{NEXT}$, $CE_{ID}$, each being essentially constructed and acting like the storage cells in the object storage 1.

Each storage cell could store a closure having at least three storage fields for storing at least three closure elements, for instance during, duration time, and signal quantity.

At least the two last mentioned closure elements could be stored in storage fields of the value/designation kind. The expression during may be provided in a TYPE field. Since the port is always providing a during operation this TYPE field could be omitted.

However, in the embodiment shown in FIG. 6 during is in form of a type 'apply ('@) place in a type field together with a predefined function name (during code). The function name is stored in the first value/designation field of the port storage cells, as for all function names (such as + − * /) belonging to the type 'apply. The during code could be an identifier denoting a function definition, which is stored in the object storage.

An identifier id can also be stored in a value/designation field. This identifier links the port structure with a during structure in the object storage.

If a field including an identifier is not needed, then only three value/designation fields are actually needed in the embodiment shown in FIG. 6. However, a fourth value/designation field marked unused could be provided in order to make the port registers compatible with the other storage cells in the computing device. It is, however, also possible to connect an extra device for VALUE IN/OUT to the fourth value/designation register. This will make the port to a port for a group of values, i.e. for duration time and two kinds of signal quantities.

Each storage cell in the port could thus also have the attribute fields. At least the last mentioned storage cells could be interconnected with buses $W_{@1}$, $W_{I1}$, $W_{T1}$, $W_{v1}$, $V_{E1}$, $W_{T2}$, $W_{v2}$, $W_m$, each bus having for instance 38 wires and connected in a bit wise manner to the bitcells in each register. The index I denotes a bus connectable to the during code fields of the registers, the index T denotes a bus connectable to the duration time value/designation fields of the registers, the index v denotes a bus connectable to the signal quantity value/designation fields of the registers, the index E denotes a bus connectable to the extra value/designation fields of the registers. The index 2 denotes a bus connected towards the surrounding, and the index 1 a bus connected to the active object storage 1, 3 possibly through a transforming interface (not shown).

It is to be noted that it is possible to have the type field including '@ and the first value/designation field including the during code omitted in practice, because the information in them will allways be the same, and thus this fact could just be embodied in the central control unit CU. Therefore, it is possible to have a port having storage cells only including two value/designation fields, one for the duration time and one for the signal quantity (not shown).

The four storage cells in the shown embodiment of the port store the next preceding closure, the actual closure, the next closure, and an identifier to future closures. The storage cells could have prescribed places and then the whole content in them could be transferred between them. A suitable structure for each bit cell in the registers can have the same structure as the bit cells in the structure arithmetic unit 3 and is shown in our copending application Ser. No. 07/739,532, now U.S. Pat. No. 5,379,387.

However, it is also possible to arrange the three first mentioned storage cells such that they could change place with each other by changing their naming, which is made by control from the central control unit CU.

The port could be provided with a different number of storage cells, e.g. one storage cell.

The Time Counter and the Time Comparator

The port includes a time counter $T_{COUNT}$. It is controlled by a clock signal $CLOCK_P$ from the central control unit CU and measures the time. It can be reset by either an external reset signal or a reset signal from the control unit CU. The time counter $T_{COUNT}$ is connected to a first selector $SEL_1$ which is controlled from the central control unit CU to either connect the output from the time counter $T_{COUNT}$ directly to the bus $W_{T2}$ connectable to the time storage fields in the storage cells or to a first input of a time comparator $T_{COMP}$. The second input of the time comparator $T_{COMP}$ is connected to the bus $W_{T2}$. The output of the time comparator is an external time output. The output of the time comparator is also transferred to the control unit CU.

The port also includes an external value input and output port pin VALUE IN/OUT. It is connected to a converter $CONV_{OUT}$ for the output signal, for instance a digital/analog converter. It is also connected to a converter $CONV_{IN}$ for the input signal, for instance an analog/digital converter sampling the input signal. The sampling frequencies could be given by the output of the time comparator $T_{COMP}$ or the reset signals to the time counter $T_{COUNT}$ (not shown). A selector $SEL_2$ connected to the bus $W_{v2}$ controllably connectable to the signal quantity registers of the storage cells $CE_{DU}$, $CE_{LAST}$, $CE_{NEXT}$ selects, by control from the central control unit CU, if a signal quantity shall be fed out from or in to the port. The control unit CU reads first the content of the registers in the storage cell including the registers to be connected to the surroundings to see if it includes the particular symbol $ meaning that the value in the register is arbitrary and can be exchanged with any possible value. Then, the control unit CU controls the port selector coupled to the register accordingly.

It is also possible to make a more complicated port. For instance the signal quantities for VALUE IN/OUT can be converted by a formula stored in the converting circuits $CONV_{IN}$ for an incomming value and $CONV_{OUT}$ for an output value. The converting function could be for instance a number of integrals, each for a different class of signal quantity signal values or the like.

It is also possible to take two values within each duration time, for instance one at the beginning and one at the end of the duration time, and to store one of them directly in a value/designation field and to feed a slope calculating device (not shown) with the two measured values and the duration time. The output of the slope calculating device could then be stored in for instance the extra value/designation field (not shown), i.e. be the extra selector device for VALUE IN/OUT.

Output of a Signal Quantity

The information to be fed out is provided in the storage cell $CE_{DU}$. Thus the cell has the information during duration time signal quantity The signal quantity in this register is known and shall therefore be fed out. The signal quantity is fetched from the signal quantity register in the storage cell and is fed out through the selector $SEL_2$, acting as a driving stage, and the converter $CONV_{OUT}$.

Input of a Signal Quantity

The information in the storage cell $CE_{DU}$ is during duration time $

The signal quantity in this register is thus unknown and the register is prepared to receive a signal quantity. The signal quantity is fetched from the port signal quantity in/output, is digitalised in the A/D converter $CONV_{IN}$, and is fed into the signal quantity register of the storage cell $CE_{DU}$.

The Duration Time is set by the Computing Device Program

The information in the storage cell $CE_{DU}$ is during duration time signal quantity Thus, the duration time is known. The time counter $T_{COUNT}$ is reset by the central control unit CU at the start of the duration time. The continually stepped up time in the counter $T_{COUNT}$ is compared to the time in the time register in the storage cell $CE_{DU}$ by the time counter $T_{COMP}$. The duration time finishes when these times are the same.

The storage cell $CE_{LAST}$ has been emptied and the storage cell $CE_{NEXT}$ filled during this duration time. At the transition to the next period the content in the storage cell $CE_{DU}$ is moved into the storage cell $CE_{LAST}$, and the signal quantity in the storage cell $CE_{NEXT}$ is moved into the storage cell $CE_{DU}$.

The Duration Time is set by the Surrounding

The information in the storage cell $CE_{DU}$ is during $ signal quantity

Thus, the duration time is unknown and the surrounding will determine it. The time counter $T_{COUNT}$ is reset by the external control at the start of the duration time. The continually stepped up time in the time counter $T_{COUNT}$ is fed to the time register of the storage cell $CE_{DU}$. When the surrounding gives the next external reset the duration time is over. Thus, the external reset signal is controlling the selector $SEL_1$ to disconnect the connection to the time counter either directly or by a zero signal from the time counter.

During this duration time the storage cell $CE_{LAST}$ has been emptied and the storage cell $CE_{NEXT}$ filled. At the transition to the next period the content in the storage cell $CE_{DU}$ is moved to the storage cell $CE_{LAST}$, and the content in the storage cell $CE_{NEXT}$ is moved into the storage cell $CE_{DU}$.

A Simple Example

In order to illustrate the operation of the port a small example will be given below. Say that we want to detect one of two different sequences, the first sequence having every second signal quantity determined, e.g. with the value 17, and all the time durations determined, e.g. 1 second, and the second sequence having all signal quantities determined, e.g. 1, 2, 3, 4, etc, but no time durations determined. The port to use is called $port_1$. The closure representation:

unify($port_1$ "internal behaviour"), where "internal behaviour" is an alt operation which denotes all alternative sequences, i.e. a large data structure of the following kind:

alt(seq(during(1s 17)during(1s $)during(1s 17) . . . seq(during($ 1)during($ 2)during($ 3) . . . ))

Now, if the input signal sequence can be unified with the above structure the input is accepted and the appropriate action can be taken. One example of an accepted sequence is ((1s 17)(1s 0)(1s 17)(1s 99)(1s 17)), which is a sequence that can be unified with the first sequence of the internal behaviour given above. Another sequence that will be accepted is ((2s 1)(4s 2)(1s 3)), which will unify with the second sequence of the internal behaviour. An example of an unaccepted sequence is ((is 2) . . . ), because the signal quantity, i.e. 2, can not be unified with the signal quantities given in the two sequences of the internal behaviour.

Embodiment of an H-Port

Figure 7:
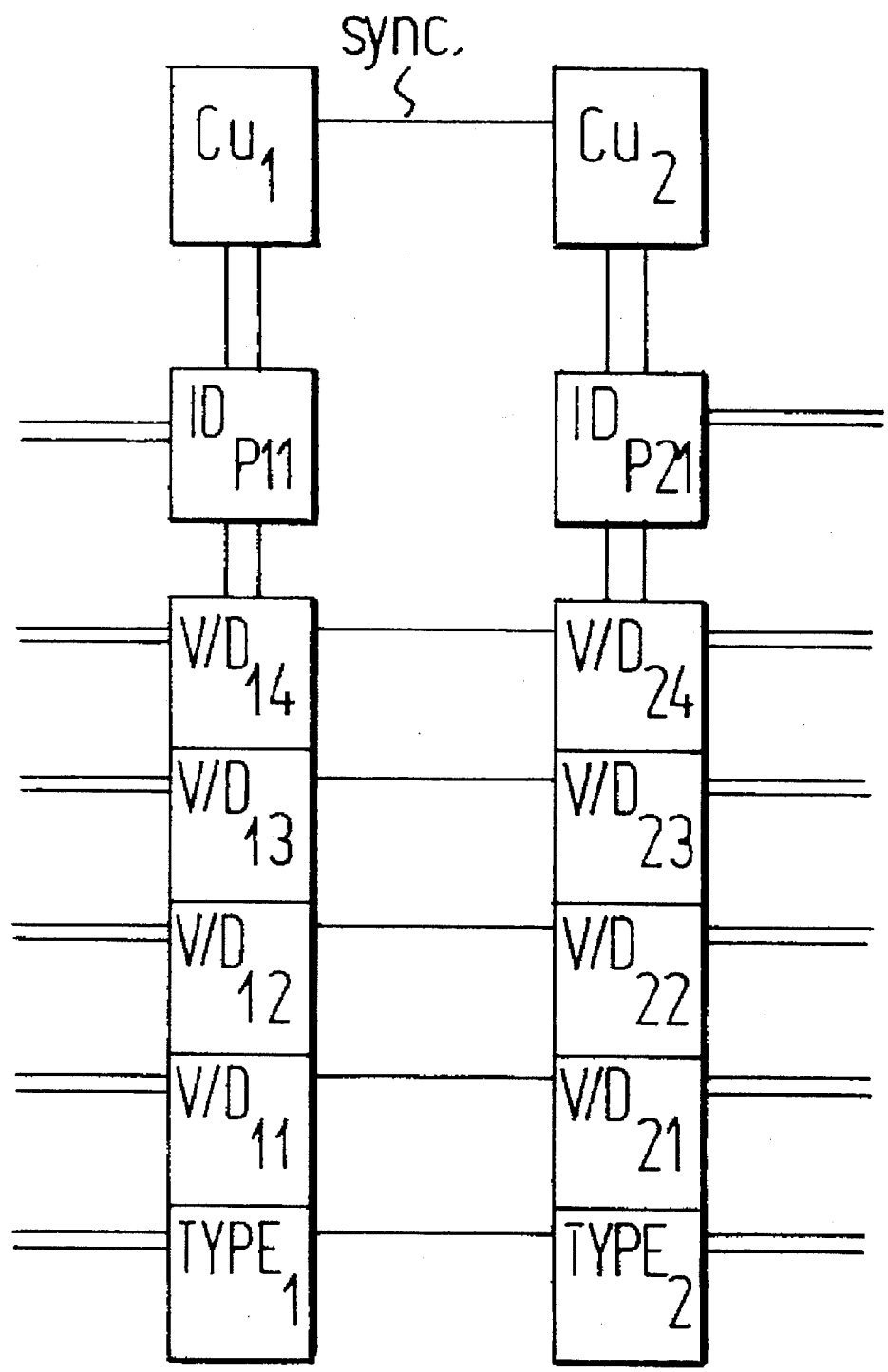
FIG. 7 shows an embodiment of a so called H-port.

The embodiment of an H-port shown in FIG. 7 is intended to connect two separately computing devices according to the invention with each other. The half of the H-port belonging to the first computing device includes a type field $TYPE_1$, four value/designation fields $V/D_{11}$, $V/D_{12}$, $V/D_{13}$, $V/D_{14}$, and an identifier register $ID_{P11}$. The half of the H-port belonging to the second computing device includes a type field $TYPE_2$, four value/designation fields $V/D_{21}$, $V/D_{22}$, $V/D_{23}$, $V/D_{24}$, and an identifier register $ID_{P21}$. In the embodiment shown in FIG. 7 the type fields and the value/designation fields of the two port halves are interconnected with a bus each. The transmission is made through serial buses.

Since it is advantageous to have as few physical interconnections as possible the best mode of operation will be to transfer data between the port halves through only one serial bus. However, such a transfer will make the internal control circuits in the central control unit CU more complicated than if the transfer is made by using one transfer bus per storage field. Interfaces for converting parallel data into serial and vice versa are not shown in FIG. 7 and are not described since they are believed to be very familiar for a person skilled in the art.

Each half of the H-port is connected to the control unit $CU_1$ and $CU_2$, respectively, controlling the computing device to which it belongs. One $CU_1$ of the control units provides a synchronizing signal SYNC synchronizing the other control unit $CU_2$. When a transmission is to be made one of the halves of the H-port includes the particular symbol $ in all its registers except the identifier register, which is indicated by the control unit, which then takes over the content in the corresponding registers in the other half.

When a large package of data of a program is to be transferred from one computing device to another through an H-port the identifiers must be changed in the receiving computing device to be adapted to the internal allotting of identifier numbers in order to avoid double usage of the same numbers. A tree is therefore transferred either from its root towards the leaves, which is to be preferred, or from the leaves towards the root, while exchanging each identifier in the transferred closures into new ones, and storing them in the object storage accordingly.

H Language Behaviours

The programming language H uses a behaviour that has three aspects of the form p t a where p, t, and a are three different modelling variables. The p, t, and a parameters model the parallelism, sequential time, and alternative actions, respectively. They could be considered as indexes labelling different parallel actions, different events and alternative behaviours, respectively. These three aspects are useful for implementing several kinds of behaviours described by special constructs in the imperative languages. They are together the central idea, i.e. the core, of the H language behaviour. The structure of the computing device according to the invention is accordingly adapted to process behaviours having these three aspects. It is to be noted that, in some applications, the modelling variable a could be more than one value, i.e. several alternative events could happen during the same time.

The Structure Arithmetic Unit (The Core Shell)

As mentioned above, the reduction operations are preferably performed in a particular structural arithmetic unit 3 to which a limited tree of cell closures are transferred when reduction is to be performed.

A brief explanation of an embodiment of the structural arithmetic unit 3 (core cell) will now be given and some examples of how expressions and values stored in the object storage will have their counterparts in the registers in the core cell 3 and the cooperation between the object storage 1 and the core cell.

Registers in the Core Cell

Figure 8A:
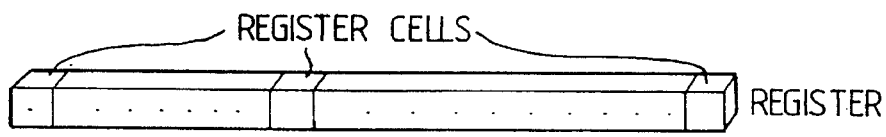
FIG. 8A, 8B, 8C show different kinds of registers in a structural arithmetic unit in the embodiment of the computing device shown in FIG. 3.
Figure 8B:
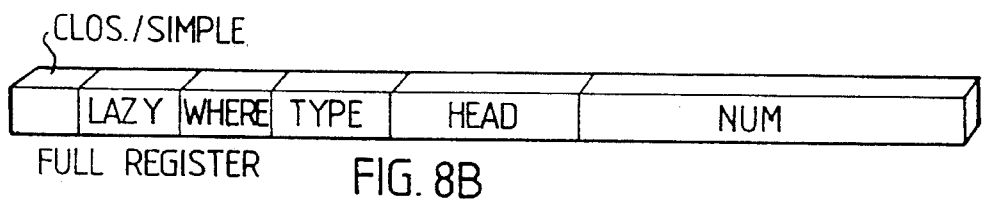
Figure 8C:
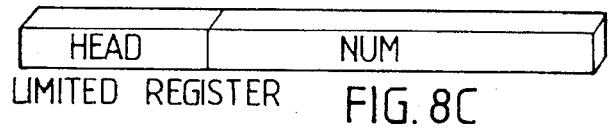
Figure 8D:
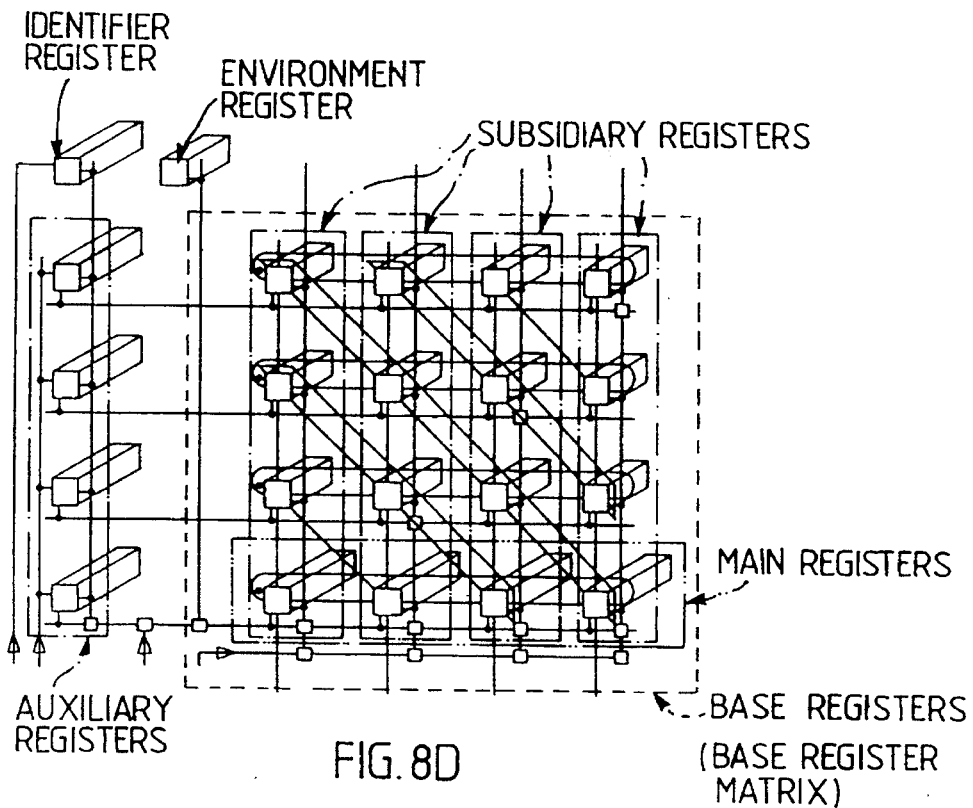
FIG. 8D shows an embodiment of a structural arithmetic unit.

The registers that could be used in an embodiment of the core cell are shown in FIGS. 8A to 8C, the configuration of the registers that could be used in an embodiment of the core cell is shown in FIG. 8D.

In FIG. 8A a register is shown. The drawing is meant to illustrate that a register is built from register cells, each cell being able to store one bit of information. The way the register is drawn is meant to illustrate that a register extends through different planes in the core cell, each register cell is situated in one plane.

FIG. 8B shows a register, which extends through all the planes in the core cell, i.e. a full register. This kind of register can hold an identifier or a value in the register cells situated in NUM and HEAD planes in the core cell. It can also hold a state, described above, in the register cells situated in TYPE, WHERE, LAZY and CLOS/SIMPLE planes in the core cell.

FIG. 8C shows a register, which extends through only the NUM and HEAD planes of the core cell, i.e. a limited register.

FIG. 8D shows a possible configuration of registers in an embodiment of the core cell. The core cell has base registers preferably arranged in a square, called the base register matrix. The base registers have a main row along one of its sides, called the main registers. The columns of base registers, each having one main register at the bottom, are called the subsidiary registers. The core cell could also be provided with an identifier register and an environment register. A line of auxiliary registers is placed at the side of the base register matrix.

In an embodiment of the core cell the subsidiary registers could be of the kind shown in FIG. 8C, i.e. limited registers, and the rest of the registers in FIG. 8D could be of the kind shown in FIG. 8B, i.e. full registers.

A more detailed description of the hardware structure of the core cell is given in our copending application Ser. No. 07/739,531. A brief description of different storage forms of data will be given with reference to FIGS. 9A to 9F and some examples of its operation will be given with reference to FIGS. 10A to 10H, 11A to 11G, and 12A to 12G.

Simple Value

Figure 9A:
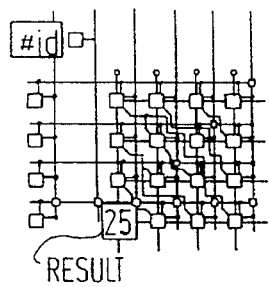
FIG. 9A to 9F show different data storage forms in a structural arithmetic unit.

As shown in FIG. 9A, a simple value 25 being a result of a reduction is present in a particular register of the main registers. This result could be one part of a cell closure.

One Level Structure

Figure 9B:
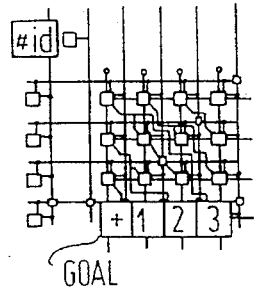

A goal is what is loaded into the core cell in order to be reduced. As shown in FIG. 9B a goal including only one level, typically being a closure without references to other cell closures, is stored in the main registers. The example shows a simple numeric operation, i.e. the addition of the values 1, 2 and 3. The numerical instruction (+) is stored in the first main register and the elements to be processed are stored in the other main registers.

Two Level Structure

Figure 9C:
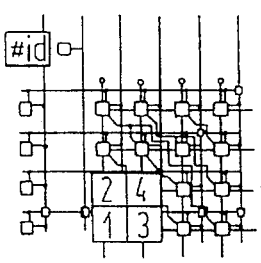

As shown in FIG. 9C a tree including a two level structure may have its root list, being a father, stored horizontally in the main registers and the lists, being sons, vertically in the base registers. In this example the structure having a list representation ((1 2) (3 4)) is stored in the base register matrix. The root list, i.e. 1 and 3, being the first elements in the sublists is stored in the main registers, and the son lists, i.e. (1 2) and (3 4), are stored vertically in the subsidiary registers. An example in which this kind of storage is used will be given below, see FIGS. 10A to 10H.

Three Level Structure

Figure 9D:
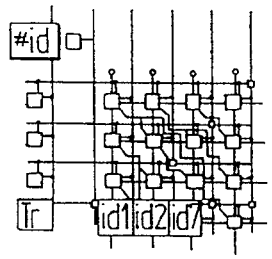
Figure 9E:
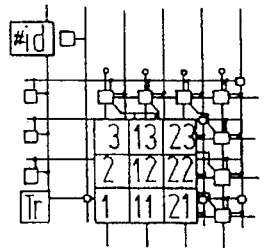

As shown in FIG. 9E, a goal tree including a three level structure has its root stored in one of the auxiliary registers and its single son is stored in the main registers. In FIG. 9D the root, which is the instruction Transpose, of the goal tree is stored in one of the auxiliary registers and its son, which is the list (id1, id2, id7), is stored in the main registers. Each element in this list is in turn a father having sons. In FIG. 9E these sons are vertically loaded in the base registers, where id1 is exchanged for the list it denotes, i.e. (1 2 3), and where id2 is exchanged for the list it denotes, i.e. (11 12 13), and where id7 is exchanged for the list it denotes, i.e. (21 22 23).

Pipe Line Mode

Figure 9F:
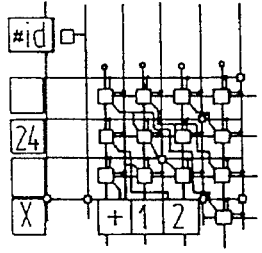

As shown in FIG. 9F, a tree stored in a pipe line mode is loaded with the goal list in the main registers and with the father of the goal in the auxiliary registers and has instructions and elements to be processed stored in both kinds of registers. The pipe line mode of operation is preferably used when reducing numeric expressions. One advantage is that intermediate results can be temporarily stored in the core cell instead of in the object storage.

Thus, the root list of a goal tree is preferably stored in different places in the registers in the core cell dependent on the level of the tree structure and the operation to be performed.

The H Language Constructs and Related Hardware

The language particularly adapted to the computing device according to the invention is called the H language. Traditional solutions to the problem of complexity have been to increase the complexity by hiding all complex matters and make simple ones visible. The computing device according to the invention uses the opposite method. All unnecessary software levels have been removed. The H language is used for everything in the machine: as machine language, programming language, operating system and communication protocol. However, like every electronic device nowadays the wiring of the computing device according to the invention could also be simulated in a computer of some extent provided with an interpreter or a compiler. An example of such a machine is a SUN3. However, the machine must have a port in which unification possibilities are provided.

Conventional logic programming languages have resolution and unification as the main semantic properties. The computing device according to the invention provided with the H language uses pattern matching for resolution and free variables and pattern matching for the unification in a reduction language. The objects in the H language, stored in fields in the storage cells, have properties of parallel existence, sequential existence and alternative existence.

The root of the goal tree is a closure of reduceable kind, such as unify, alt, apply, and in a certain sense also par and seq, since they can sometimes be reduced to nothing. In the function application apply (also called @) the first element is an instruction (+ − * / during) directly interpreted by the hardware or an identifier indirectly designating a closure structure used as a function definition, and the rest of the elements are arguments to the instruction/function definition. As mentioned above, the computing device according to the invention is adapted to process the specific declarative language called H which is defined by an abstract syntax and a semantic.

The syntax describes a number of different abstract objects by the aids of expressions. The following basic expressions could be used:

port, nothing, alt(list), par(list), seq(list), unify(list), during(list), cont(v), period(v), where (list) is specified in form of data elements $(e_1, \ldots e_n)$ in the object storage cell(s) containing the expression to which it belongs, and v is a real number.

Since each storage cell in a wired application of the invention has a limited number of value/designation fields a list can be stored in a number of storage cells. It is to be noted that, if the structure of the object storage is simulated by a program in a computer of common type, then a simulated storage cell could have a varying number of storage fields.

| | |
|---|---|
| Port | expression stand for a physical port, i.e. a sequence of durings, and is a special kind of indirect element. |
| Nothing | is a special kind of value standing for contradiction. |
| Alt | indicates that the storage cell including this expression includes listed elements considered as alternative elements. |
| Par | indicates that the storage cell including this expression includes listed elements considered as parallel elements. |
| Seq | indicates that the storage cell including this expression includes listed elements considered as sequential elements. |
| Unify | indicates that the storage cell including this expression includes listed elements considered as elements to be unified. |
| During or '@ (...) | indicates that the storage cell including this expression includes listed elements giving duration times during which something shall happen. |
| cont | denotes a space quantity having an infinite number of infinitesimal behaviours along a distance having the length v. |
| period | denotes a time duration having a number of infinitesimal short behaviours during a period having the duration v. |

The elements in the list are stored as values in the value/designation fields.

A rewriting facility is built in into the central control device CU cooperating with the storage cells. Thus the control device embodies the rewriting rules. It rewrites said syntax expressions in accordance with predetermined rewrite rules.

The central control device is preferably a boolean gate array, which is connected to read the stored expressions and to provide the rewriting operations in accordance with built in rules. Only a part of a tree need be read at the time. The construction of boolean gate arrays having the abilities to react on composed inputs to provide composed outputs in accordance with a built in protocol is described in the publication "Introduction to VLSI Systems" by Carver Mead and Lynn Conway, Addison Wesley Publishing Company, 1980.

The Rewrite Rules

The rewrite rules are the following:

| | |
|---|---|
| alt | |
| alt( ) | -> nothing |
| alt(e) | -> e |
| alt($e_1$ ... nothing ... $e_n$) | -> alt($e_1$ ... $e_n$) (i. e. the value nothing is omitted) |
| alt($e_1$ ... alt($c_1$ ... $c_k$) ... $e_n$) | -> alt($e_1$ ... $c_1$ ... $c_k$ ... $e_n$) |
| par | |
| par($e_1$ ... nothing ... $e_n$) | -> nothing if any of the values $e_1$ to $e_n$ is nothing |
| par($e_1$ ... alt($c_1$ ... $c_k$) ... $e_n$) | -> alt (par($e_1$ ... $c_1$ ... $e_n$) ... par($e_1$ ... $c_k$ ... $e_n$)) |
| par($e_1$ ... $e_n$) | -> par($e_1$ ... $e_n$) otherwise |
| seq | |
| seq($e_1$ ... nothing ... $e_n$) | -> nothing if any of the values $e_1$ to $e_n$ is nothing |
| seq($e_1$ ... alt($c_1$ ... $c_k$) ... $e_n$) | -> alt (seq($e_1$ ... $c_1$ ... $e_n$) ... seq($e_1$ ... $c_k$ ... $e_n$)) |
| seq($e_1$ ... $e_n$) | -> seq($e_1$ ... $e_n$) |
| unify | |
| unify( ) | -> nothing |
| unify(e) | -> e |
| unify($e_1$ ... $e_n$) | -> $e_1$ if all $e_1$ to $e_n$ are the same |
| unify($e_1$ ... $e_n$) | -> nothing if any of $e_1$ to $e_n$ is different from the others |
| unify($e_1$ $e_2$ $e_3$ ... $e_n$) | -> unify(unify($e_1$ $e_2$) $e_3$ ... $e_n$) |
| unify($e_1$ ... $e_n$) | -> nothing if any of the values $e_1$ to $e_n$ is nothing |
| unify($e_1$ ... alt($c_1$ ... $c_k$) ... $e_n$) | -> alt(unify(e1 ... c1 ... en) ... unify($e_1$ ... $c_k$ ... $e_n$)) |

When a reduction of a tree structure stored in the object storage is to be made, at least a part of the tree structure is transferred to the unit 3. A further description of different possibilities of processing a tree structure in the unit 3 will be given below for a particular embodiment of the arrangement in FIG. 3.

The control unit CU reads the TYPE fields in the cell closures now stored in the unit 3 and rewrites, i.e. rearranges, the contents in the cell closures in the unit 3 in accordance with the rewrite rules mentioned above and transfers the rewritten result back to be stored in the object storage 1. If the rewritten result is reduced down to a value or nothing the control unit CU makes a global search through the object storage to exchange the content in storage fields designating the fathers of the reduced structure into the value the reduction resulted in.

The procedure of operation using these syntax rules will now be exemplified. The syntax rules not illustrated in the examples below are very similar to the ones illustrated and are easily understood by a person skilled in the art, when taken in conjunction with the examples below.

EXAMPLE 1

The first example shown in FIG. 10A to 10H is a unification of parallel values given as the reduceable closure unify(par(1 par(1) 3) par(1 par(1) 2))

which is a reduceable closure in which several parallel unifications shall be made. This reduceable closure is to be rewritten as a parallel structure of unifications.

Figure 10A:
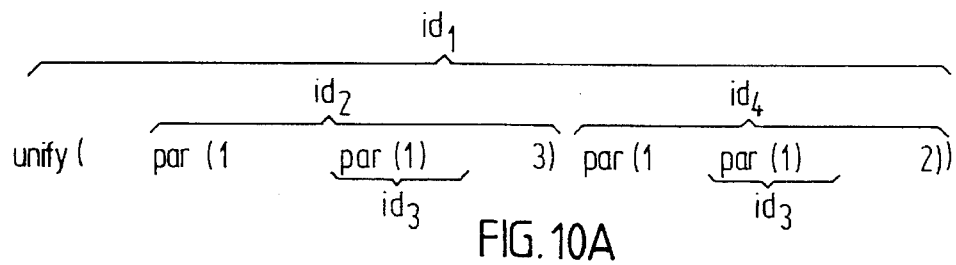
Figure 10B:
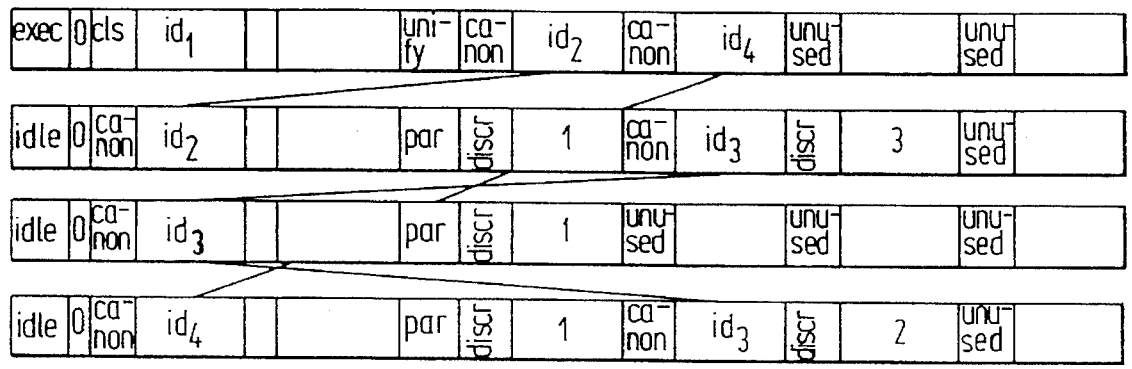

FIG. 10A shows the initial reduceable closure. FIG. 10B shows how this reduceable closure is stored in the object storage. The storage cells in which different parts of the reduceable closure are stored are marked out in FIG. 10A. The links between element closures and cell closures are marked out in FIG. 10B. The cell closure having the identifier $id_1$ is tagged cls, and has the type code unify in the type field and the cell closures having the identifiers $id_2$, $id_3$ and $id_4$ have the type code par in their type fields. The cell closure having the identifier $id_1$ includes as its first two value/designation closure elements designating the cell closures having the identifier $id_2$ and $id_4$. These cell closures are tagged canon. The cell closure having the identifier $id_2$ has its first and third value/designation closure elements provided with discrete values having the tag discr and its second value/designation closure element designating the cell closure having the identifier $id_3$ and thus is tagged canon. The cell closure having the identifier $id_3$ has its first value/designation closure element provided with an integer and thus tagged discr. The cell closure having the identifier $id_4$ includes as its first and third value/designation closure elements provided with discrete values having the tag discr and its second value/designation closure element designating the cell closure having the identifier $id_3$ and thus tagged canon.

Figures 10C, 10D:
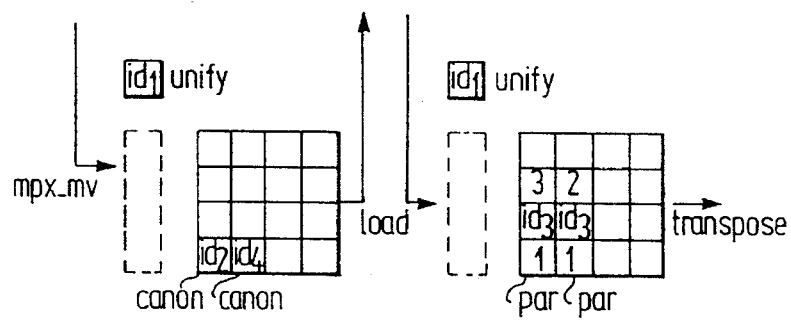

As shown in FIG. 10C, the content of the storage cell with the cell closure having the identifier $id_1$ is first loaded into the core cell placing its identifier in the identifier register as $id_1$ including the type code unify of the closure, and the value/designation elements as the goal in the main registers in a first operation step.

As shown in FIG. 10D, the sons having the identifiers $id_2$ and $id_4$ are loaded vertically in the base registers such that the content in their first value/identifier element is placed in the main register marked with its identifier and the rest of its value/identifier elements in registers in a vertical column thereabove. The type code par of each of these sons is also loaded in the main register. The type code is loaded into the register cells situated in the TYPE planes.

Figures 10E, 10F:
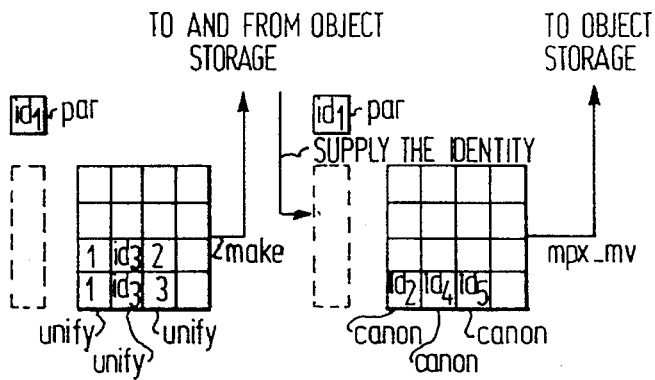

As shown in FIG. 10E, the content of the base registers are transposed 90°, such that the content in the first vertical column of the base registers are placed in the main registers and the second vertical column is placed in a row in the base registers parallel to the main registers. The type codes par and unify provided in the identifier register and the main registers are exchanged, which is done automatically by the control unit. Now the base registers includes a father having three sons placed in columns.

Each son is now loaded back into the object storage using the instruction make. As an answer from the object storage the identifiers for the stored sons are provided and stored in the main registers. It is to be observed that the control unit CU being a kind of gate array is sensing the contents particularly in the registers in the planes CLOS/SIMPLE to TYPE and is providing the instructions, i.e. controls the switches and the gates, according to the information found there. The sons have been named in sequence order after $id_1$ and already occupied names are not used. However, the order of the names is of no importance, and could thus be arbitrary.

As shown in FIG. 10F, the first son gets the identifier $id_2$, the second son, containing the element closures occupying the identifier $id_3$, gets the identifier $i_4$, and the third son gets the identifier $id_5$. The father having the element closures linked to the cell closures having the identifiers $id_2$, $id_4$, $id_5$ has kept its identifier $id_1$ and is then stored in the object storage.

Figure 10G:
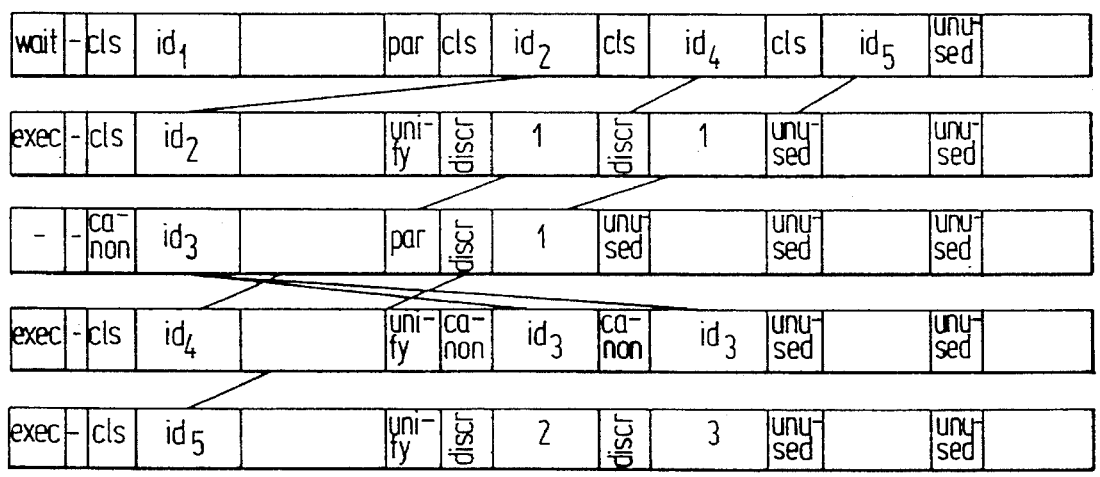

FIG. 10G shows the storage cells storing the reduceable closure par(unify(1 1) unify(par(1) par(1)) unify(2 3))

Figure 10H:
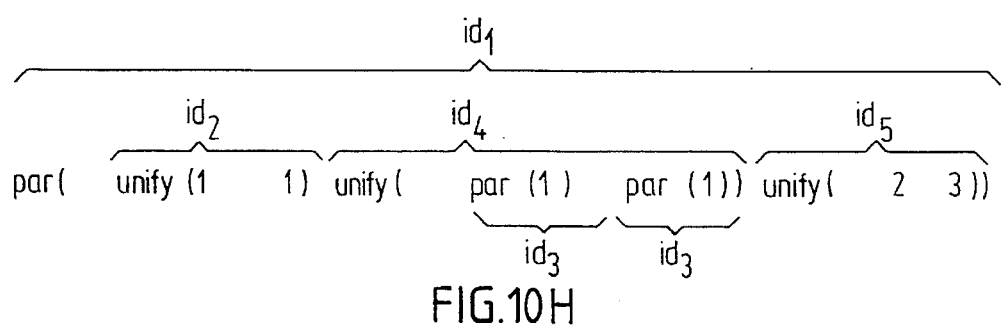

The reduceable closure itself is shown in FIG. 10H. FIGS. 10G and 10H are shown in the same way as FIGS. 10A and 10B and are therefore self explanatory.

In FIG. 10G it is also shown that the cell closures having the type code unify has been given the notation exec in the LAZY field and the cell closure having the identifier $id_1$ has been given the notation wait, which means that the cell closures being marked exec should be executed before the cell closure denoted by the identifier $id_1$ in order to reduce their contents into values.

The closure in FIG. 10H could, at a later point in time, be loaded back into the core cell for further processing. For instance, the cell closure having the identifier $id_2$ will have the value 1, because the values 1 and 1 in its value/designation elements are the same, and the cell closure having the identifier $id_5$ will result in nothing, because the values 2 and 3 in its value/designation elements are not the same.

Each unification can in a preferred embodiment be made in the numeric ALU which compares the values in comparators and provides the result of the comparison to the control unit CU. The control unit then sets its boolean gate array to provide the information in the first main register in the core cell accordingly. When a reduction has resulted in a canonical designation or simple value or nothing, it is globally distributed to all the storage fields in the object storage being operable to store element closures of the second kind such that each indirect designation to the reduced closure is changed to the direct designation of the value.

EXAMPLE 2

This example is a hardware instruction list expansion meaning that the cell closure includes an inserted list. This kind of instruction is an auxiliary step in other reductions.

The machine makes a reduction of an exemplifying instruction, called ex.type, and which could be any kind of instruction which includes values and lists having the form ex.type(1 list(2 3 list(4 5 6))7)

The form is shown in FIG. 11A and its cell closures in FIG 11B. FIGS. 11A and 11B are marked out in the same way as FIGS. 10A and 10B and are therefore self explanatory.

Figures 11C, 11D:
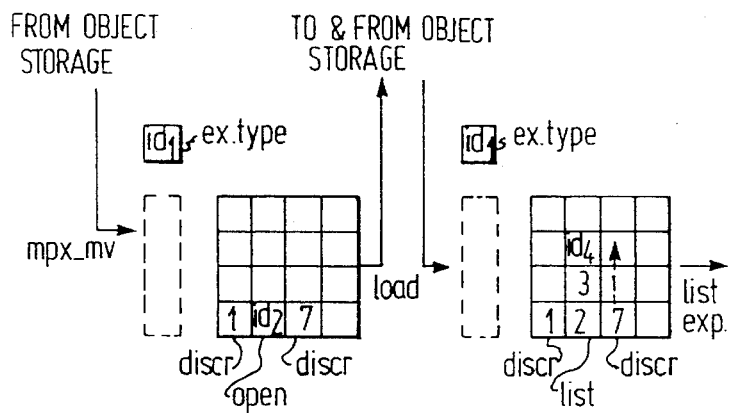

As shown in FIG. 11C, the cell closure having the identifier $id_1$ is loaded into the main registers of the core cell having its identifier and the type code in the identifier register. Since the content in the second main register is marked with an indirect element open, the cell closure $id_2$ to which it is linked is loaded vertically in the base registers as a son, as apparent from FIG. 11D.

Figures 11E, 11F, 11G:
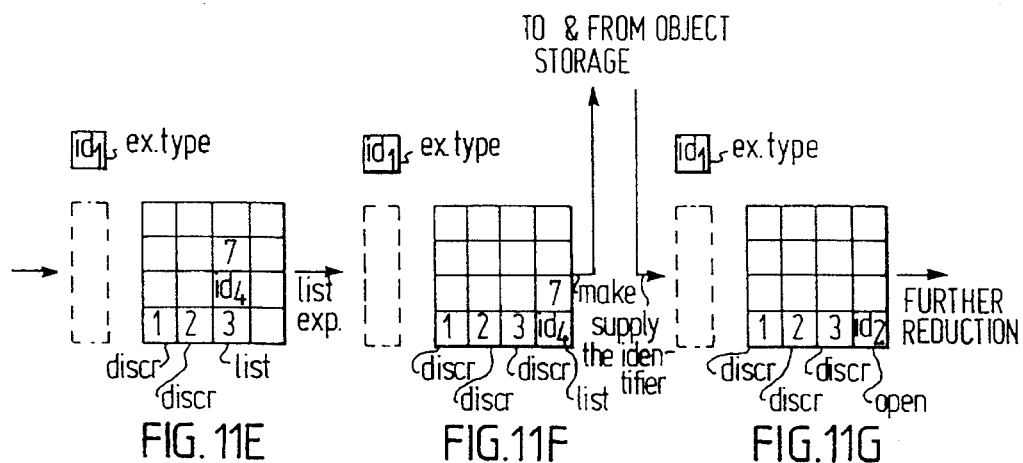

The hardware instruction list expand then moves the discrete value 7 in the third main register to the position beside $id_4$ in the third base column and moves the part of the list in the second column above the second main register to the third column placing its lowest element (the value 3) in the third main register and giving it the type code list (see FIG. 11E). Since the content in the second main register is a discrete value it has the tag discr.

Then, a new list expansion is made placing the content in the third column above the main register in the fourth column typing it as a list. The content in the third main register being a discrete value is tagged discr, as apparent from FIG. 11F.

Then, the list in the fourth column is stored in the object storage using the hardware instruction make. It is stored in the storage cell having the identifier $id_2$, since it has become idle, and a supply of the identifier $id_2$ is sent back to the core cell to be stored in the fourth main register, as shown in FIG. 11G.

Thereafter further reduction is made of ex.type, and when a canonical result is provided the result of the reduction is loaded back into the object storage.

A PRACTICAL EXAMPLE—THE FIRST APPROACH

Returning to FIG. 3, the basic idea according to the invention for the operation at a port is to see the mutual behaviour of the surrounding 7, 8 and the active object storage 1, 3 as a unification which should result in that the signal quantities in every duration time gets only one defined value in common.

In order to give an understanding of the way of operation the following example is given: A machine having an input port and an output port is to provide the squared input signal quantities on the output. The program to be stored in the machine will therefore be:

unify(par($port_{in}$ $port_{out}$) "machine behaviour")

where "machine behaviour" is an alt operation which denotes all sequences of thinkable pairs of input and output, i.e. a large data structure of the following kind:

```
alt(seq(par(during(1s 1)during(1s 1) )
        (par(during(is 2)during(1s 4) )
        (par(during(1s 3)during(1s 9) )
        ...)
    (seq(par(during(1s 1)during(1s 1) )
        (par(during(1s 3)during(1s 9) )
        (par(during(1s 2)during(1s 4) )
        ...)
    (seq(par(during(1s 2)during(1s 4) )
        (par(during(1s 1)during(1s 1) )
        (par(during(1s 3)during(1s 9) )
        ...)
    (seq(par(during(1s 2)during(1s 4) )
        (par(during(1s 3)during(1s 9) )
        (par(during(1s 1)during(1s 1) )
        ...)
    (seq(par(during(1s 3)during(1s 9) )
        (par(during(1s 1)during(1s 1) )
        (par(during(1s 2)during(1s 4) )
        ...) )
```

When the input port begins to deliver its values, the reduction operations made in the core cell will successively delete all branches in the alternative operation alt which turns into nothing, i.e. the branches which do not fit.

The following reduction rules are executed in the core cell: An expression of the form

```
unify(par(port_1 ... port_n)
    seq(par(during(q_11 t_1) ... during(q_1n t_1) )
        ...
        (par(during(q_k1 t_k) ... during(q_kn t_k)
        ...)
is rewritten into
nothing
or into the expression
seq(par(during(q_11 t_1) ... during(q_1n t_1) )
    ...
    (par(during(q_k1 t_k) ... during(q_kn t_k)
    ...)
``` depending on a comparison of the signal from the environment and the expression. All durings in every operation par in the seq take the same time. Synchronisation is needed in order to make all during operations to start and stop at the same time.

An alternative way to make the rewriting of the expression above is to rewrite it into:

```
nothing
or into the expression
seq(during(par(q_11 ... q_1n) t_1)
    ...
    (during(par(q_k1 ... q_kn) t_k)
    ...)
``` depending on a comparison of the signal from the environment and the expression.

By using the first rewrite rule above in the given example the following reduction rule is implicated:

```
unify(par(e_1 ... e_n) par(h_1 ... h_n) ) ->
    ->par)(unify e_1 h_1) ... unify e_n h_n)
``` and the corresponding for seq. As soon as an input value does not unify with, i.e. is not the same as, the corresponding value in the machine, the result is nothing. This will propagate all the way up to the alt operation and the whole branch is deleted from the alt expression.

Communication with the Outside World

The ingenuity in constructing the port such that the values can be transferred in to or out from the machine dependent upon if the external signal is defined or not or if the machine value is defined or not (having the value $) is that the machine is not limited to the simple input port and output port system described above. Thus, it is possible to write a program in which a port is alternately written into and read out from the machine. An example on this is the following program:

unify(port "machine behaviour")

having the machine behaviour:

---
alt (seq(during 1s 1)(during 1s 1)(during 1s 2)(during 1s 4)
    (seq(during 1s 1)(during 1s 1)(during 1s 3)(during 1s 9)
    (seq(during 1s 2)(during 1s 4)(during 1s 1)(during 1s 1)
    (seq(during 1s 3)(during 1s 9)(during 1s 2)(during 1s 4)
etc
i.e.
(seq(during input)(during output)(during input)(during output)
---

In this machine behaviour the surrounding provides a value and the machine answers by feeding out the square of it during the next interval. This method gives full control over how the data shall flow in a simple way.

The unit 3 communicates with the ports and is adapted to store the input from the port in the object storage in a sequence. It is provided as an expression of the form:

unify(port seq(during $t_1$ $q_1$) ... seq(during $t_k$ $q_k$) ... )

When this expression is reduced the protocol in the central control unit CU is such that it rewrites this expression into nothing or into the expression seq(during $newt_1$ $newq_1$) ... seq(during $newt_k$ $newq_k$) ... )

depending on a comparison of the signal from the environment and the expression. In the expressions $newt_i$ is a new duration time and $newq_i$ a new signal quantity for the i:th interval in the sequence of value pairs (see FIG. 2).

If the signal at the port has the form shown in FIG. 2 the unify expression above will be rewritten to nothing in the unit 3, if the value $q_i$ of the signal is different from the corresponding quantity $q_i$ given in the unify expression or if the value $t_i$ of the signal is different from the corresponding $t_i$ given in the unify expression. Otherwise the unify expression is rewritten into the seq expression. As mentioned above a particular symbol $ could be provided in the unify expression indicating that the value could be arbitrary.

If the value $t_i$ or $q_i$, i being an arbitrary integer, in the expression are $ then the corresponding $newt_1$ or $newq_i$ will be rewritten with the measured quantities $t_i$ or $q_i$ inserted.

Correspondingly, if the signal from the surrounding is undefined, while the values $t_i$ and $q_i$ of the unify expression are specific values, then the signal strength is provided as $q_i$ by the digital/analogue converter $CONV_{OUT}$ in the port (see FIG. 6) during the time $t_i$, while $newt_i$ and $newq_i$ of the seq expression are the same as the values $t_i$ and $q_i$ if the unify expression.

Additional H Language Constructs

All behaviours that can exist may be described in accordance with the system described above. Unfortunately, the programs can be extremely large. In order to deal with such a situation further language constructions can be inserted. The most important of them are symb, lambda and apply.

A full syntax useful for the H language could include the following syntax expressions:

cont(v), delta, period(v), deltat, par(list), seq(list), 'alt(list), 'con-(list), 'pri(list), lambda(list), hide(list), 'symb(list), 'unify(list) 'set(list), 'apply(list) alt(list), nothing, con(list), pri(list), unify(list), lambda(list), hide(list), set(list), apply(list), symb(list), discr(n), pulses(n), where the syntax expressions are provided as operators in coded form in the type fields in the storage cells.

Thus, each expression is an operator stored as an expression in an object storage cell, and each of the elements in (list) is a list element indicating a behaviour, n being an integer and v a real number. Each element is storable in a storage field in the storage cell containing said expression to which the list belongs.

The expression cont(v) in which v is a real number denotes a space quantity having an infinite number of infinitesimal behaviours along a distance having the length v. The expression period(v) in which v is a real number denotes a time duration having an infinite number of infinitesimally short behaviours during a period having the duration v.

The expression delta denotes a behaviour having atomic extension in space and having an indefinite time duration. The expression deltat denotes a behaviour having atomic extension in time and having an indefinite extension in space.

To Express Quantities as Compositions

An integer extension in space could be coded as a par of delta in the following way:

---
0=par( )
1=par(delta)
2=par(delta delta)
...
5=par(delta delta delta delta delta)
etc
---

An integer extension in time could be coded as a par of deltat in the same manner.

Thus an integer (discr (n)) is conceived as a flat composition of a kind of atomic units delta.

A very important use of the quantities is as elements in a during operation. In this operation quantities are used to indicate both time and space. Therefore the time correspondence to delta called deltat is used.

delta is atomic in space and indefinite in time deltat is indefinite in space and atomic in time The expressions above are stored in the object storage in the same manner as the syntax expressions.

Programs as "Language", Expressions having a '

The machine reduces all expressions being inserted almost instantly to their value. For example the expression apply(+par(2 4))

is directly reduced to the value 6. This makes it impossible to have access to a program once it is installed. It is impossible to break it up in parts and make calculations over the parts.

In order to be able to make such maneuvers a passive parallel to the basic language is introduced. They are called the program forms. They reduce to themselves (they are canonic) and thus stand still. They can thus be broken into pieces.

A function plusrevarg can be defined in the following way:

unify(symb(plusrevarg) lambda(par(y x) 'apply(+par(x, y)))

which given the program form corresponding to the program above,

'apply(+par(2 4) gives us the argument of the plus set in reversed order, par(4 2).

In order to convert a stored program form to the corresponding program a standard function eval is used. Thus, the program is copied and the "blips" are then taken away. The program is then naturally reduced further to its value.

apply(symb(eval)'apply(+part)(2 4)))=apply(+par(2 4)))=6

The possibility to decompose program forms makes it simple to "reason over" programs, and this makes it simple to write interpreters and compilers for other languages of any arbitrary kind using a machine having the H-language as its basic language.

As a general rule, all constructors (e.g. delta, par) have a second form proceeded by ' as one lexical element (e.g. 'delta, 'par) specifying the form as a program form. It is important to note that only the actual construct and not the entire tree is in a program form. In order to specify an entire tree as program form all constructs must be marked with '.

If the list in a program form (having a ') includes nothing, then the expression will be converted to nothing.

To Form Programs

The mechanisms needed for making definitions, such as the definition of sqr, are described above. However, a comfortable mechanism to form a program as a composition of small definitions is needed. We want to build a program as a main expression having a number of auxiliary definitions. This is made by aid of con(list).

Con

The con construct contains a visible value v and several invisible values $e_i$, i being an integer between 1 and n.

con(v $e_1$ $e_2$ $e_3$ ... $e_n$)

This structure has the value equal to the first element v.

However, if the list is empty or any of the elements of the list is nothing the con construct has the value nothing. All elements of the list are in the same scope. Thus, the non-visible elements can be used as constraints, either binding values to free variables or unifying values to nothing.

The rewriting rules for con are:

| | |
|---|---|
| con( ) | ->nothing |
| con($e_1$ ... nothing ... $e_n$) | ->nothing |
| con($e_1$ ... $e_n$) | ->$e_1$ |

As for all rules, this rule is also built in as a cooperation between the active storage 1, 3 and the central control unit CU.

Pri

None of the constructions described above can be used for indicating that something is valid if something else is not valid (is nothing). Since a "negative" way of expression sometimes is much more compact than a "positive" way of expression a construction pri for "negative" way of expression is added.

The reduction rules for pri are such that the value of a pri is the first element which is different from nothing. If such an element is not there the pri will be nothing. Thus:

pri(nothing nothing 9 nothing 7 8)=9

The construction pri($e_1$ $e_2$) can be interpreted in the following way: if $e_1$ is not valid then $e_2$ is to be used.

The pri construct resembles the alt construct. It is a set of behaviours, but in a pri the behaviours are in an ordered set. The first behaviour is the first of the list, the second the second etc.

It is important to note that the pri construct has nothing in common with the priority concept used in conventional languages and machines for process scheduling. Instead it is used to implement negation by failure.

The rewriting rules for pri are:

| | |
|---|---|
| pri( ) | ->nothing |
| pri(nothing$_1$ ... nothing$_n$) | ->nothing |
| pri(nothing$_1$ ... nothing$_{k-1}$ $e_k$ ... $e_n$) | ->$e_k$ |

As for all rules, this rule is also built in as a cooperation between the active storage 1, 3 and the central control unit CU.

Scope Rules

A scope is a textual environment within which all occurrences of the same symbol stands for the same semantic entity. A scope rule states if, and then how, a certain construct introduces a new scope. The H-language has the following scope rules:

1. The constructs par, seq, alt, @ and unify do not introduce a new scope. This means that all occurrences of the same symbol in an expression stands for the same entity.
2. The construct lambda(substitute pattern) introduces a new subordinated scope. All occurrences of symbols in the rule which are not mentioned in the superior scope belong to the new scope.
3. The construct hide(expression) introduces a completely new scope. No occurrence of a symbol in a rule construct hide stands for the same entity as the same symbol in the rule construct surrounding the hide-construct.

Hide

When extensive programs are produced it is necessary to use the same symbols in different senses. This can be provided by having a construct (hide) which introduces isolated scopes.

The very important concept of hiding is mainly used for isolating a use of an object and the definition of the particular object. The user of the computing device according to the invention may find this in program package, library and implementation concepts.

The H language defines the hide construct hide(e). It defines a behaviour. Free variables used inside and outside the construct are separated, i.e. they are not visible from each other. This feature of the H-language is different from other kinds of languages which generally export a data type and several symbol names. Such names cannot be used internally in a package. This means that the global symbol domain is really global to all packages, and visible inside them, in full or in a limited set.

A typical program package is specified in the following way:

lambda(a_pkg $ $).hide( . . . local implementation . . . );

It defines a rule having a pattern starting with a_pkg and the rest undefined. This is only a definition of a rule where symbols local to the rule substitute is unknown.

A library is a package in the H language concept using a parameter selecting one or several rules. It may be implemented as

```
hide(
    alt(lambda "rule a".a-spec
    lambda "rule b".b-spec
    . . .
    lambda "rule n".n-spec) )
```

The library is an alternative containing rules. The pattern "rule a" is used to select a program a spec. It may be defined as an arbitrary construct, but is generally an abstraction or a rule.

As demonstrated above the H-language has an elegant method to specify the software engineering concepts needed. The language need not introduce new language constructs for this purpose.

It is to be observed that hide only influences the handling of scope.

Lambda

The expression lambda($e_s$ $e_{p1}$ . . . $e_{pm}$ . . . ) is a rule expressing that the element $e_s$ replaces $e_{p1}$ . . . $e_{pm}$; where $e_r$ is a rule lambda ($e_s$ $e_{p1}$ . . . $e_{pm}$) and said expression apply($e_r$ $e_{arg1}$ . . . $e_{arg2}$) is an application which in a reduction operation is replaced by $e_s$, if each $e_{pi}$ unifies with the corresponding $e_{argi}$ (i=1 to n) or otherwise is replaced by nothing.

Apply

An example of how the rule, apply, is implemented will now be given.

EXAMPLE 3

A numeric instruction is to be executed. A numeric instruction can be +, −, *, /, during, etc. After the instruction the arguments will follow. In this example an addition between the numbers in a list is to be made. The machine makes a reduction of an apply (application) having the form apply(+list(1 2))

The application is shown in FIG. 12A and its cell closures in FIG. 12B. FIGS. 12A and 12B are marked out in the same way as FIGS. 10A and 10B and are therefore self explanatory.

As shown in FIG. 12C, the cell closure having the identifier $id_1$ is loaded into the main registers of the core cell having its identifier and type code in the identifier register. The numeric instruction (+) is marked as an instruction. Since the content in the second main register is tagged as an indirect element open, the cell closure to which it is linked is loaded as a son vertically in the base registers, as apparent from FIG. 12D.

A list expansion is then made, tagging the discrete value in the second main register as discr, and marking the list expanded value 2 as list in the type code field. This is done because the machine makes the same operation whether the list having the identifier $id_2$ had two, three or four elements. Since there is only one element in the new list the machine replaces the mark list with an indication that the main register contains a value which is discr, as apparent from FIG. 12F.

Then the main register includes an instruction mark (+) and two discrete values, and this causes the control unit in which instructions are stored, to control the numeric ALU to perform the instruction (addition) and to deliver the result of the numeric operation as a canonical value to the first main register, as shown in FIG. 12G. It is to be noted that the notation apply in the type code field is a marking that an function application is to be made. The result value, in this case the simple value 3, is then distributed globally in order to exchange every occurrence of the identifier $id_1$ for this value.

Rewriting Rules

The rewriting rules specify the expressions that are equal. A rewrite direction is associated with these rules. A simpler expression will result when following the rewrite direction. When the expression cannot be rewritten into a simpler expression it is canonical. Thus, the computing device according to the invention uses the rewriting rules for rewriting expressions into more canonical forms.

Besides the rewriting rules given above, the central control unit CU embodies also the following rewriting rules:

| | |
|---|---|
| type($e_1$ . . . nothing . . . $e_n$) | −> nothing, where type stands for an expression on the list above from par(list) up to unify(list), and $e_1$ . . . $e_n$ are list elements. |
| type($e_1$ . . . alt($c_1$ . . . $c_k$) . . . $e_n$) −> alt(type($e_1$ . . . $c_1$ . . . $e_n$) . . . type($e_1$ . . . $c_k$ . . . $e_n$ ) ) where type stand for an expression on the list above from par(list) up to unify(list) (except alt(list) ), and $e_1$, $e_n$, $c_1$, $c_k$ are list elements. | |
| set( ) | −> nothing |
| set(a) | 'alt(a), if a is an expression from par(list) to 'apply(list) in the expression list above. |
| set(alt($e_1$ . . . $e_n$) ) | −> 'alt($e_a$ . . . $e_n$) where $e_1$ . . . $e_n$ are elements not provided in any particular order and $e_a$ . . . $e_m$ are provided in a |

-continued

| | sorted order |
|---|---|
| set($e_1 \ldots e_n$) | -> set(con($e_1 \ldots e_n$) ) |
| lambda(alt($e_1 \ldots e_n$) ) | -> set(alt($e_1 \ldots e_n$) ) |
| lambda($e_1 \ldots e_n$) | -> par($e_1 \ldots e_n$) |
| hide(alt($e_1 \ldots e_n$) ) | -> set(alt($e_1 \ldots e_n$) ) |
| hide($e_1 \ldots e_n$) | -> par($e_1 \ldots e_n$) |
| apply( ) | -> nothing |
| apply(e) | -> $eval_{meta}$ (e) |
| apply('alt($b_1 \ldots b_n$)$a_2 \ldots a_m$) | -> apply($eval_{meta}$ 'alt($b_1 \ldots b_n$)$a_2 \ldots a_m$) |
| apply(par($b_1 \ldots b_n$)$a_2 \ldots a_m$) | -> nothing, if all $b_i$ and $a_i$ are expressions from par(list) to 'apply(list) in the expression list above, and n#m or any $a_i$#$b_i$ for i>1 |
| apply(par($b_1 \ldots b_n$)$a_2 \ldots a_m$) | -> $b_1$, if all $b_i$ and $a_i$ are expressions from par(list) to 'apply(list) in the expression list above, and n=m and all $a_i$=$b_i$ for i>1 |
| apply(seq($b_1 \ldots b_n$)$a_2 \ldots a_m$) | -> nothing, if all $b_i$ and $a_i$ are expressions from par(list) to 'apply(list) in the expression list above, and n#m or any $a_i$#$b_i$ for i>1 |
| apply(seq($b_1 \ldots b_n$)$a_2 \ldots a_m$) | -> $b_1$, if all $b_i$ and $a_i$ are expressions from par(list) to 'apply(list) in the expression list above, and n=m and all $a_i$=$b_i$ for i>1 |

The function $eval_{meta}$ transforms expressions in program form (i.e. provided with ') to a value form (i.e. without ').
Only the highest structure gets its ' taken away.

| $eval_{meta}$ 'type(a) | -> type(a), where type stand for an expression on the list above from par(list) up to unify(list) (except alt(list) ) |
|---|---|
| symb | |

The expression symb(s) including an element s which when reduced into a canonical expression is an identifier, said element s having an ability to have been stored in storage fields belonging to different storage cells in said object storage, said storage cells being defined to be arranged in scopes, all identifiers s within each scope denoting the same behaviour.

Discr, Pulses

The expression discr (n) in which n is an integer denotes a parallel behaviour having the number of n atomic behaviours. The expression pulses(n) in which n is an integer denotes a time chain of n atomic behaviours.

Following rewriting rules are due:

| par($delta_1 \ldots delta_n$) | ->discr(n) |
|---|---|
| seq($deltat_1 \ldots deltat_n$) | ->pulses(n) |

A PRACTICAL EXAMPLE—THE SECOND APPROACH

In order to exemplify how the extended syntax can be used, the program for alternative reading and writing at the same port could be provided in a more compact way. First the notion square (sqr), over the discrete values 1, 2, and 3, is defined by the following short program:

unify(symb(sqr)alt(lambda(1 1) lambda(4 2)lambda(9 3))

stored in a tree of closures in the object storage 1. Then the "machine behaviour" can be written as only one seq operation:

seq(during(1s x)during(1s apply(symb(sqr) x) (during(1s x)during(1s apply(symb(sqr) x) . . . )

This seq operation will during execution be rewritten into the alt operation shown above. Even this program is as long as the input data. A way to handle this in an elegant way is to provide a number of functions and standard alternatives in the hardware, or as software loaded together with the program of interest.

An example is multiplication (x) and with the aid of this standard operation the square of the value a can be written as the simple program:

unify(symb(sqr) lambda(symb(a) apply(x par(symb(a) symb(a)))));

This program squares all numbers defined by the hardware.

These rules may be used for writing small recursive programs which during rewriting in accordance with the reduction rules are unfolded to the large alt constructions mentioned above. The hardware is such that unnecessary unfolding is omitted. This is preferably done by using a core cell of the form described in our copending application Ser. No. 07/739,532, now U.S. Pat. No. 5,379,387.

The behaviour of the computing device having the opportunities to perform the described rewriting rules, implying a declarative approach by using unification of behaviours, is specified by explicitly specifying elapsing time order. The temporal description looks somewhat like a denotational language.

Making the Programs More Readable

The abstract syntax is quite simple. This makes it unfortunately not particularly readable. In order to make the programs more readable a more complicated syntax is introduced, because human beings do not want to have a level of complexity which is too low.

This transformation could be made in many different ways. However, it is natural to have a textual (with text) and a graphic form.

Fault

A fault indication is provided when the hardware detects that a value is not correct, for instance by checking parity bits on computed values or the like. Then the expression backup is used.

The reduction rules for backup are such that the value of a backup is the first element which is different from fault. If such an element is not there the backup will be nothing.

The rewriting rules for backup are:

| backup( ) | ->fault |
|---|---|
| backup($fault_1 \ldots fault_n$) | ->fault | backup(fault₁ ... fault_{k-1} e_k ... e_n)    ->e_k

As for all rules also these rules are built in as a cooperation between the active storage 1, 3 and the central control unit.

Several Language Representations

As has been apparent from the above the language H has several representations. The language has a core Habs which is an abstract language on which a family of representations are used. The main language representations are:

$H_{abs}$ this language representation is the most basic one available outside the formal definition. It is fully declarative. However, it has no user readable syntax.

$H_{fault}$ this language representation is $H_{abs}$ extended by constructs for modelling hardware faults in the computing device. This language representation is not declarative; instead the result is a stochastical value. This representation is the root language representation on which all the rest of the language representations are based. It has no user readable syntax.

$H_{user}$ this language representation is $H_{fault}$ enhanced with built sets for integer and real arithmetic and operators for numeric and structure arithmetic, Also infinite alternatives are included. The language representation $H_{user}$ has no user readable syntax. This representation is the abstract language visible for the users.

$H_{ascii}$ a language representation using normal ascii characters and prefix notation for all syntax except the most common expressions using infix syntax.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

We claim:

1. A computing device of reduction type for reducing programs stored therein, comprising:

at least one port means for connecting said computing device with at least one external device connected to said at least one port means;

an active associative storage means for associatively storing and retrieving data elements, said active associative storage means being connected to said at least one port means and comprising a plurality of storage cell means for storing and executing at least part of a computer program stored therein;

a structural arithmetic means comprising a matrix of interconnected registers of storage cell means for storing and reducing at least part of computer programs stored therein; and a bus means for connecting each of said storage cell means of said active associative storage means to said structural arithmetic means and to said at least one port means, said at least one port means comprising comparison means for comparing, by a unification operation, data provided by said at least one external device to said at least one port means with data stored in at least one of a plurality of storage cells contained in said port means, said data provided by said at least one external device and said stored data each having possible undefined data elements or partially defined elements.

2. A computing device according to claim 1, wherein said at least one port means comprises means for comparing a signal sequence provided to said port means with a signal sequence stored in at least one of said plurality of storage cell means, and means for rewriting said compared sequence into a value representing contradiction, if a comparison indicates a difference, and to rewrite said compared sequence into another sequence according to rewrite rules if the comparison indicates that said signal sequences are the same.

3. A computing device according to claim 2, wherein said comparison means comprises a comparator to make comparisons between groups comprising at least two data elements, in a list of such groups.

4. A computing device according to claim 2, wherein said port means comprises at least one analog-to-digital converter having selectively variable sampling periods to provide said sequence as a sampled signal changing with time having individual sampling periods, said signal sequence being a list of groups of elements, each group including a duration time and at least one signal quantity during that time.

5. A computing device according to claim 1, wherein said at least one port means comprises means for transferring data to at least one other port means of another computing device of similar construction as said computing device, by synchronizing said duration times on one of said port means with at least one other port means of said another computing device to make a parallel transfer of signal quantities between said ports during each duration time.

6. A computing device according to claim 1, wherein reduction of syntax expressions is carried out in accordance with predetermined rewrite rules embodied in a central control unit CU cooperating with and connected to said active associative storage means, said central control unit comprising a boolean gate array configured so as to carry out said rewrite rules.

7. A computing device according to claim 1, wherein each storage cell storage means further comprises means for storing at least one of the means is adapted to store at least one of the following indicia:

marks denoting if the expression in said storage cell means shall be reduced;

marks denoting if the expression is a member of a tree, and the properties of the expression, marks denoting how the expression is created, marks denoting if the expression constitutes a number of repeated behaviors, marks denoting if the expression is a part of a list having other list members stored in another storage cell.

8. A computing device according to claim 1, wherein said device comprises a region including storage cells means of a read only type.

* * * * *